(12) United States Patent
Kawashima et al.

(10) Patent No.: US 6,403,291 B1
(45) Date of Patent: Jun. 11, 2002

(54) MULTIPLE EXPOSURE METHOD

(75) Inventors: Miyoko Kawashima, Utsunomiya; Akiyoshi Suzuki, Tokyo; Kenji Saitoh, Utsunomiya, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/340,134

(22) Filed: Jun. 28, 1999

(30) Foreign Application Priority Data

Jun. 30, 1998 (JP) .......................................... 10-184237
Jun. 22, 1999 (JP) .......................................... 11-175204

(51) Int. Cl.⁷ .............................. G03C 5/00; G03C 5/04
(52) U.S. Cl. .......................... 430/394; 430/5; 430/311; 430/396
(58) Field of Search ............................. 430/5, 311, 312, 430/30, 394, 396

(56) References Cited

U.S. PATENT DOCUMENTS

| 5,415,835 A | 5/1995 | Brueck et al. | ............... 430/311 |
| 5,851,707 A | * 12/1998 | Shibuya et al. | ................. 430/5 |

FOREIGN PATENT DOCUMENTS

| JP | 63-42122 | 2/1988 |
| JP | 2-244708 | 9/1990 |
| JP | 4-277612 | 10/1992 |
| JP | 07-226362 | 8/1995 |
| JP | 08-320572 | 12/1996 |

OTHER PUBLICATIONS

Hasegawa, et al., "Practical Applications of Ideal Exposure Method", SPIE vol. 3873, pp. 65–77 (Sep. 1999).
Hasegawa, et al., "New Approach for Realizing K1=0.3 Optical Lithography", SPIE vol. 3748, pp. 278–279 (Sep. 1999).
Saitoh, et al., "Practical Use of Ideal Exposure Method", Silicon Technology, vol. No. 11, pp. 6–11.

* cited by examiner

Primary Examiner—Mark. F. Huff
Assistant Examiner—Saleha R. Mohamedulla
(74) Attorney, Agent, or Firm—Fitzpatrick, Cella, Harper & Scinto

(57) ABSTRACT

A multiple exposure method includes a step of exposing a photosensitive material with a first pattern having a periodic pattern, and a step of exposing the photosensitive material with a second pattern different from the first pattern by using a projection optical system, wherein the step of exposing the photosensitive material with the second pattern is performed in each of a plurality of positions of the photosensitive material in an optical axis direction of the projection optical system relative to a focus position of an image of the second pattern, and wherein a desired pattern is formed in the photosensitive material by a multiple exposure including the step of exposing the photosensitive material with the first pattern and the step of exposing the photosensitive material with the second pattern.

35 Claims, 28 Drawing Sheets

FIG. 2(A)
FIG. 2(B)
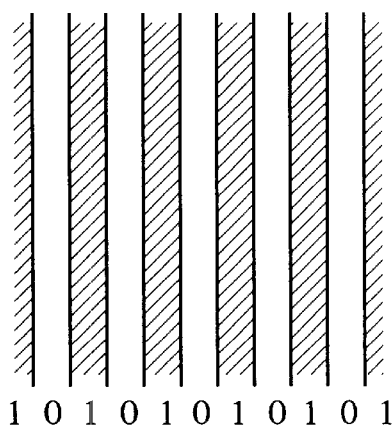
1 0 1 0 1 0 1 0 1 0 1
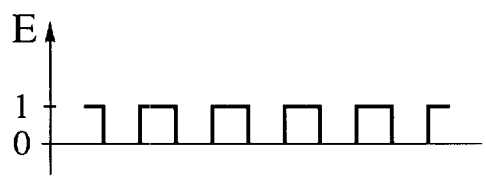
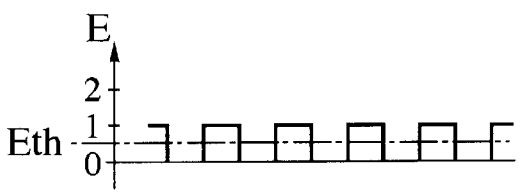
FIG. 3(A)
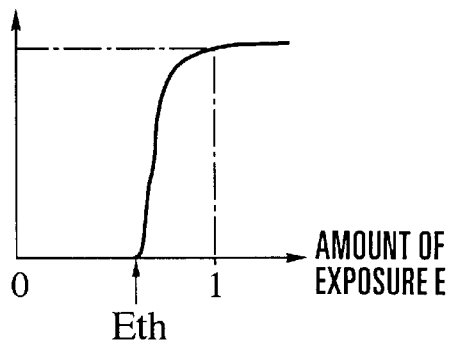
$E_{th}$ IN THE CASE OF NEGATIVE RESIST
FIG. 3(B)
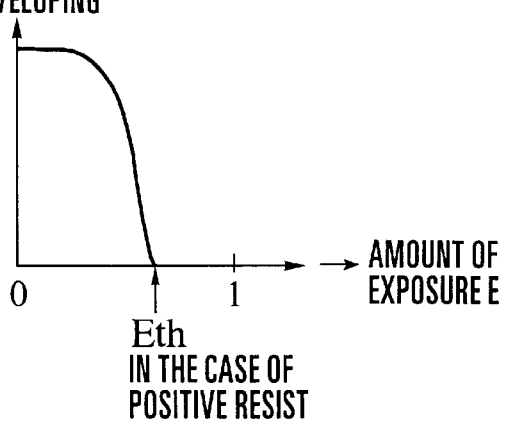
$E_{th}$ IN THE CASE OF POSITIVE RESIST FIG. 4
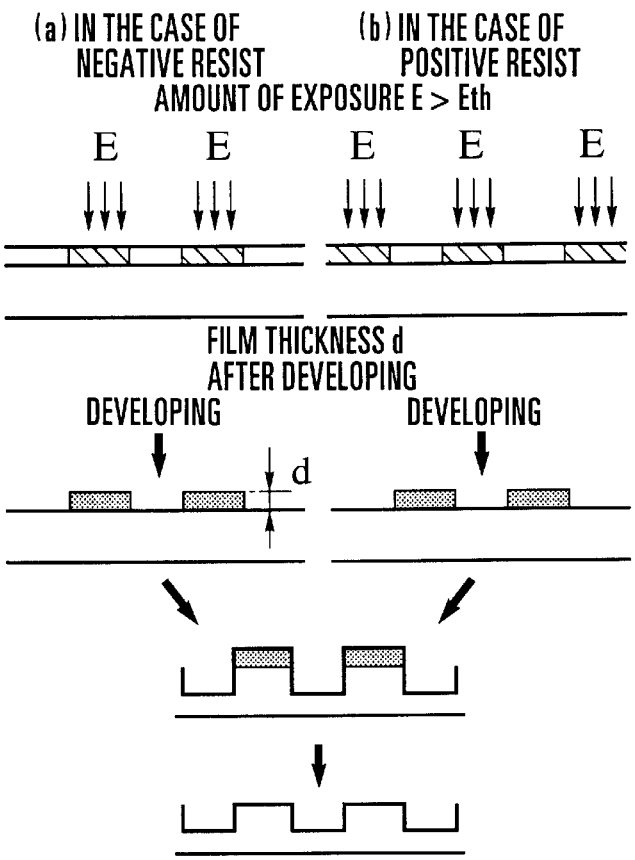
FIG. 5
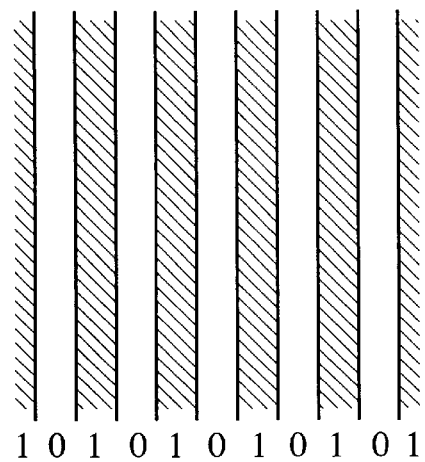
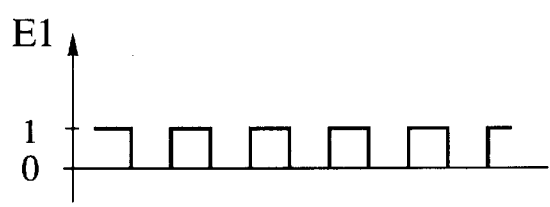

$E = E1 + E2 \ (E2 = 0)$ 0 0 0 0 1 0 0 0 0 0

$E = E1 + E2$

FIG. 8(A)
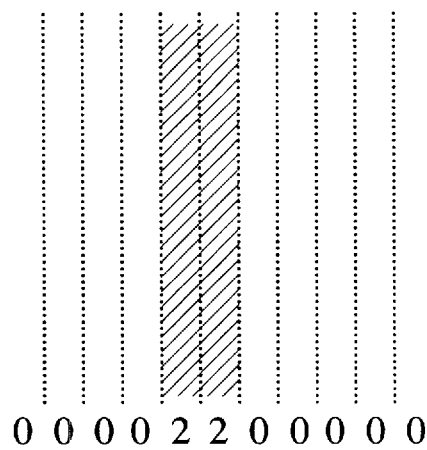
0 0 0 0 2 2 0 0 0 0
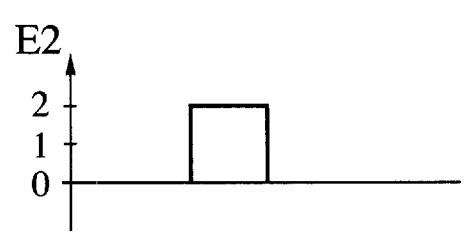
FIG. 8(B)
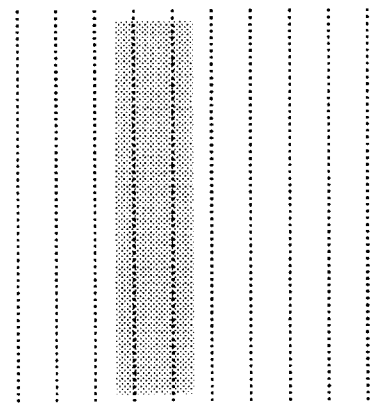
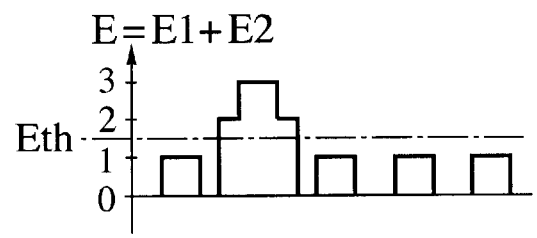
FIG. 9(A)
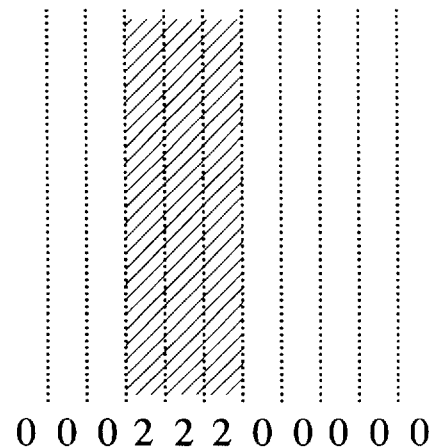
0 0 0 2 2 2 0 0 0 0
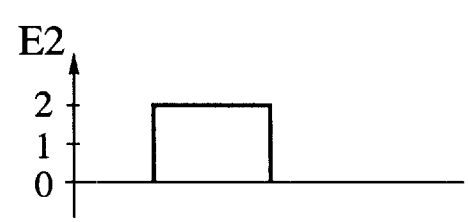
FIG. 9(B)
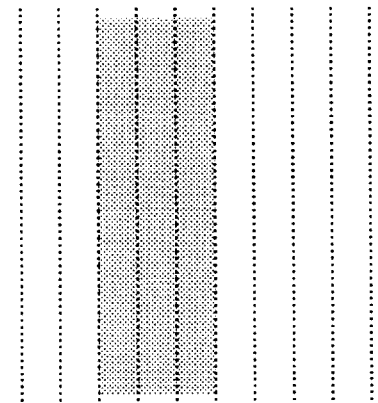
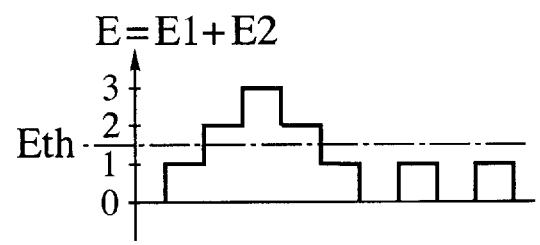

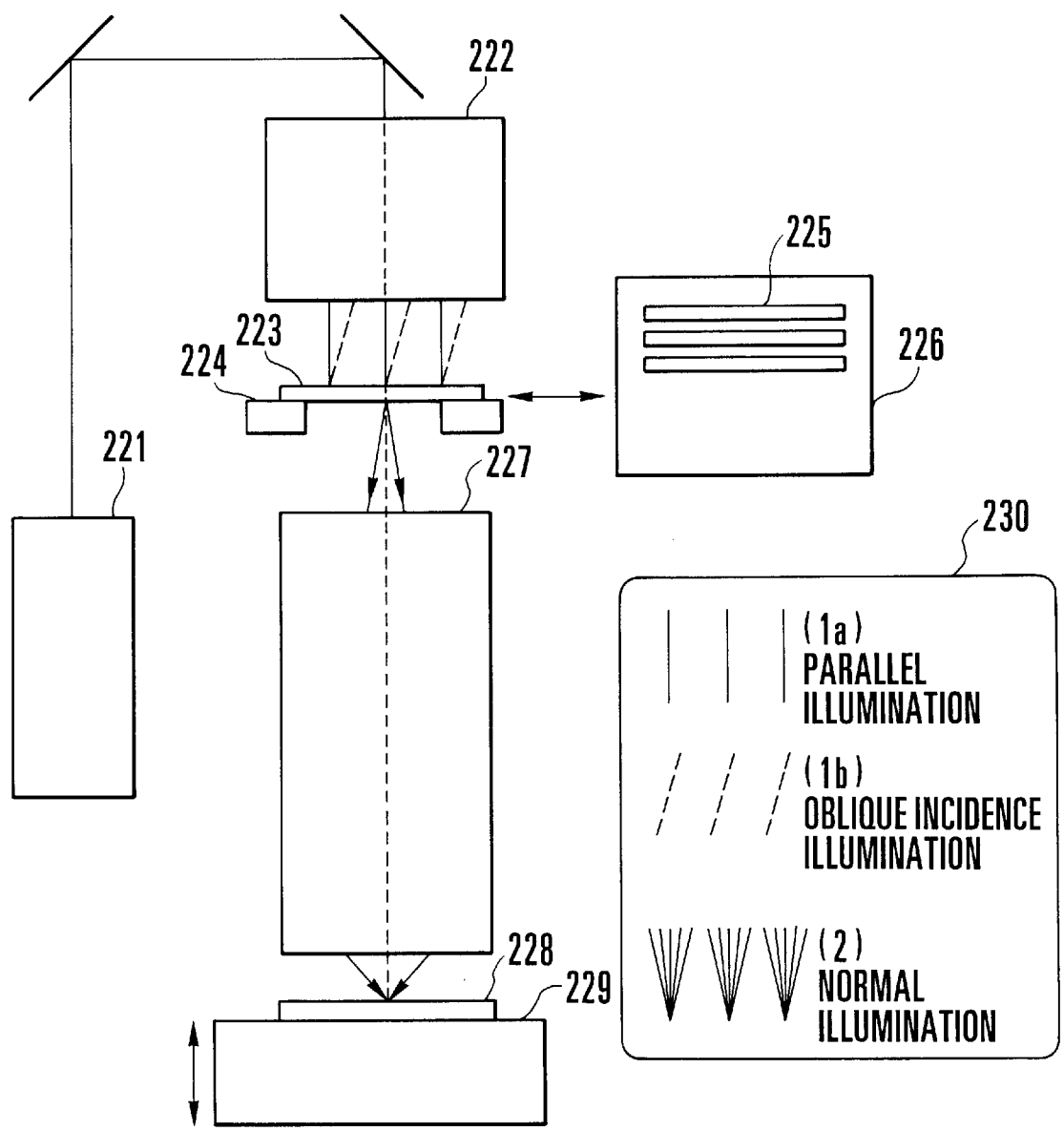

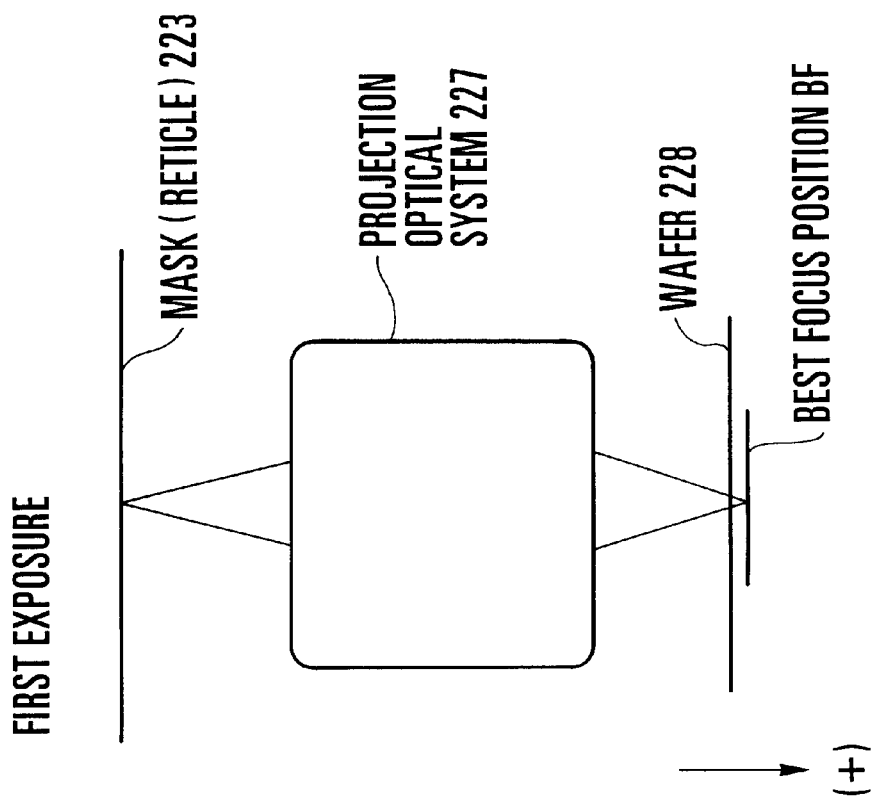
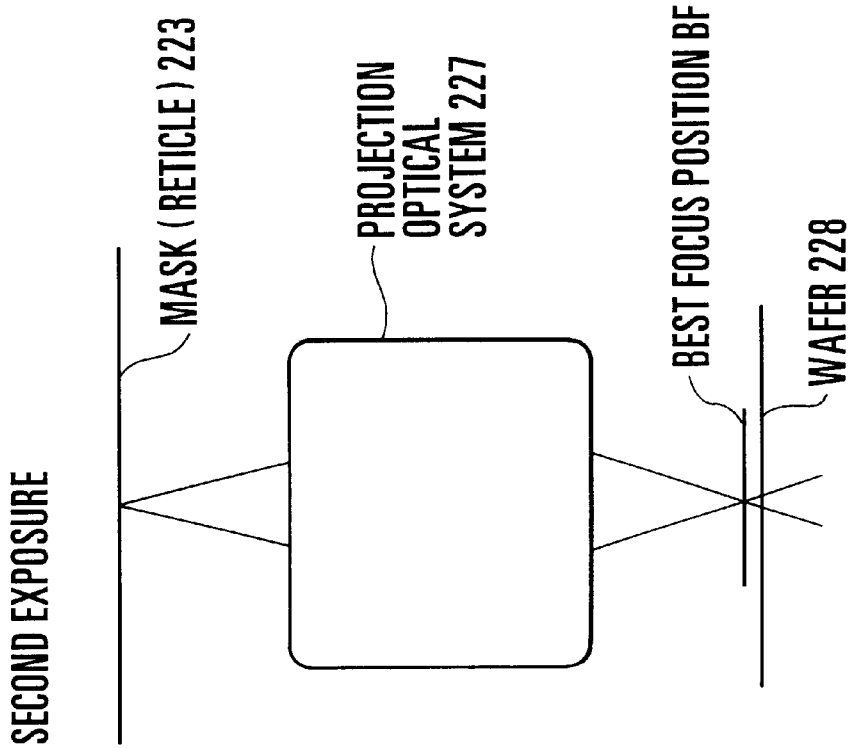
FIG. 22(A) FIRST EXPOSURE
FIG. 22(B) SECOND EXPOSURE

FIG. 29

ONE EXPOSURE AT $\lambda - \Delta\lambda$

| def: 0.0000 | def: 0.2500 | def: 0.5000 | def: 0.7500 | def: 1.0000 |

ONE EXPOSURE AT $\lambda + \Delta\lambda$

| def: -1.0000 | def: -0.7500 | def: -0.5000 | def: -0.2500 | def: 0.0000 |

AFTER DOUBLE EXPOSURE: SUPERPOSITION OF EXPOSURES AT $\lambda - \Delta\lambda$ AND AT $\lambda + \Delta\lambda$

| def: -1.0000 | def: -0.7500 | def: -0.5000 | def: -0.2500 | def: 0.0000 |

| def: 0.2500 | def: 0.5000 | def: 0.7500 | def: 1.0000 |

AFTER TRIPLE EXPOSURE: SUPERPOSITION OF PERIODIC PATTERN EXPOSURE AT $\lambda$ ON DOUBLE EXPOSURE

| def: -1.0000 | def: -0.7500 | def: -0.5000 | def: -0.2500 | def: 0.0000 |

| def: 0.2500 | def: 0.5000 | def: 0.7500 | def: 1.0000 |

FIG. 30
ONE EXPOSURE AT $\lambda - \Delta\lambda$                                        def: 0.0000
| def: -0.2500 | def: 0.5000 | def: 0.7500 | def: 1.0000 |
|---|---|---|---|
|  |  |  |  |
AFTER DOUBLE EXPOSURE:    SUPERPOSITION OF EXPOSURES AT $\lambda - \Delta\lambda$ AND AT $\lambda + \Delta\lambda$
| def: -0.7500 | def: -0.5000 | def: -0.2500 | def: 0.0000 |
|---|---|---|---|
|  |  |  |  |
| def: 0.2500 | def: 0.5000 | def: 0.7500 | def: 1.0000 |
|  |  |  |  |
AFTER TRIPLE EXPOSURE:    SUPERPOSITION OF PERIODIC PATTERN EXPOSURE AT $\lambda$ ON DOUBLE EXPOSURE
                                                                                           def: -1.0000
| def: -0.7500 | def: -0.5000 | def: -0.2500 | def: 0.0000 |
|---|---|---|---|
|  |  |  |  |
| def: 0.2500 | def: 0.5000 | def: 0.7500 | def: 1.0000 |
|  |  |  |  |

F I G. 31
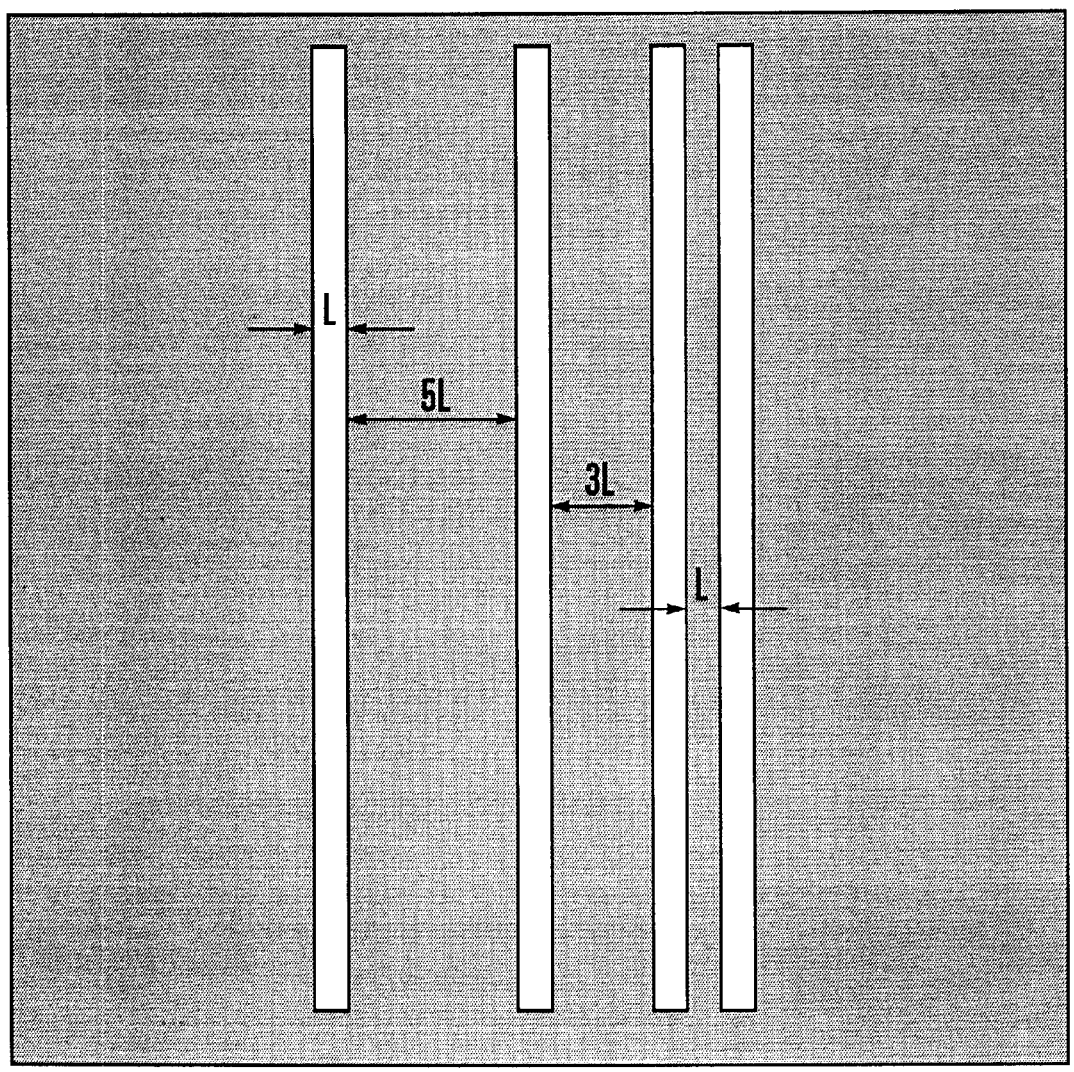

FIG. 32
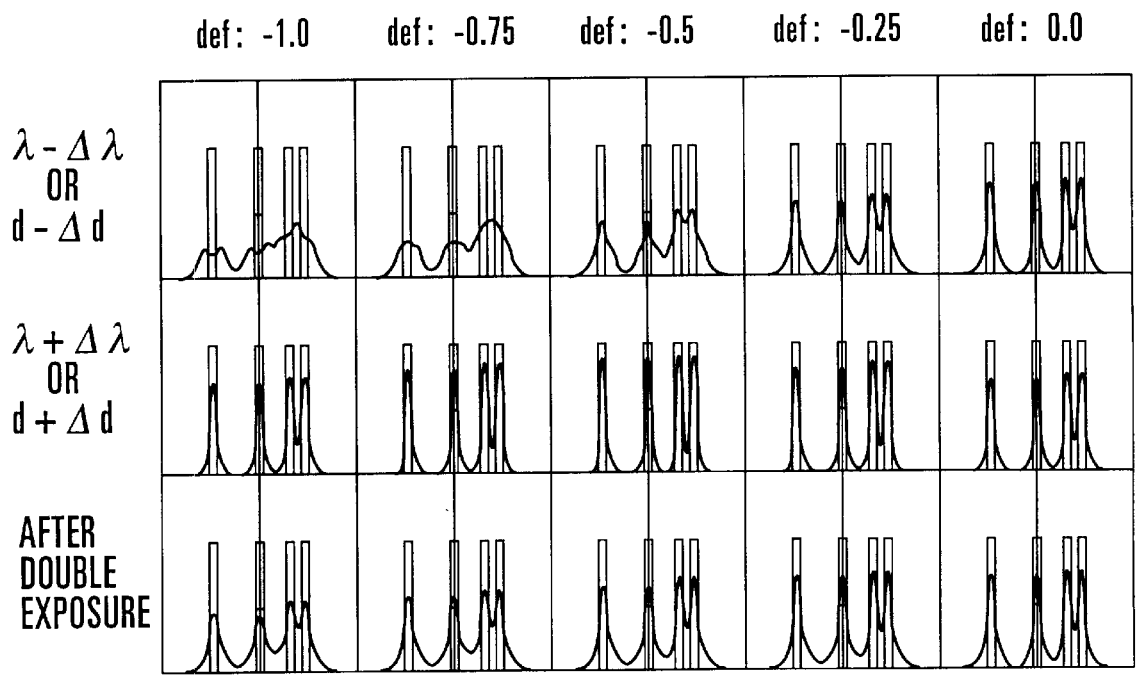
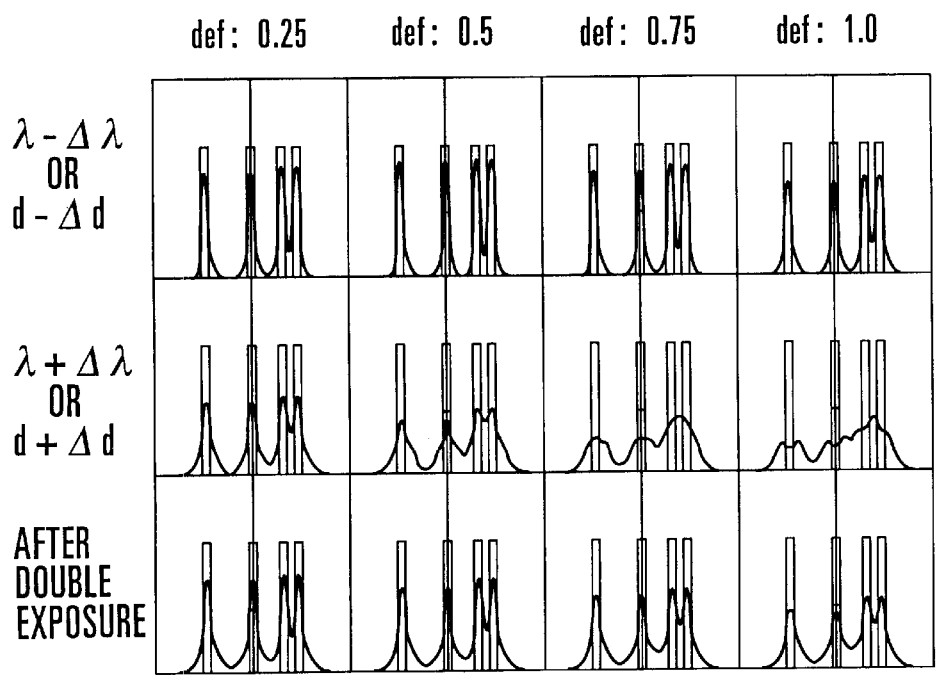

FIG. 34
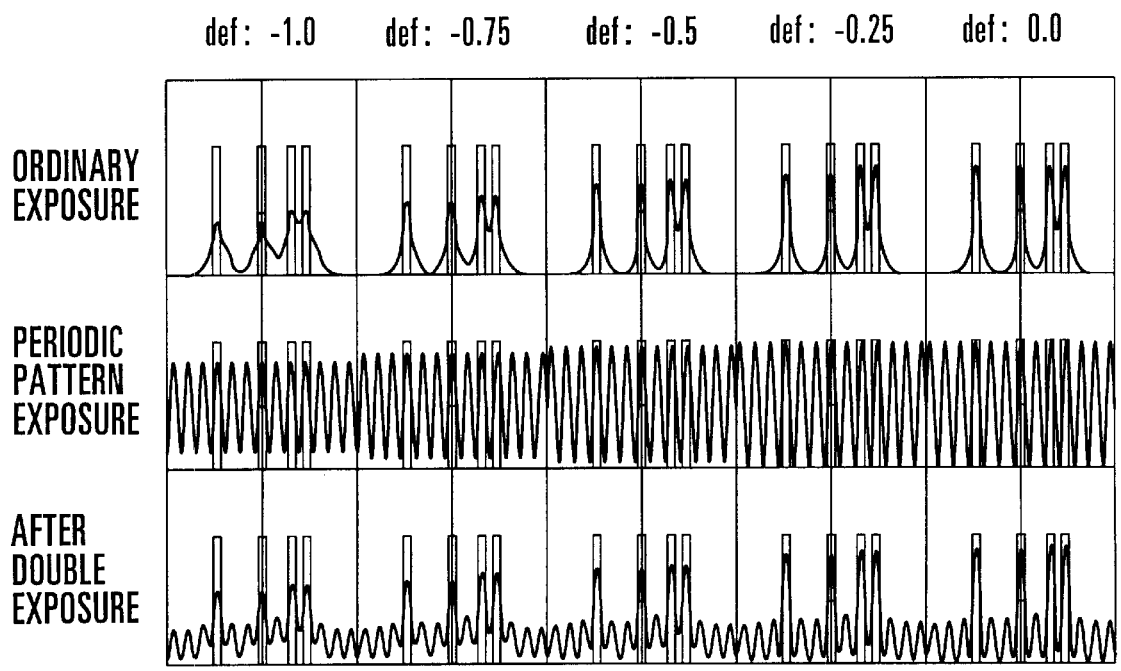
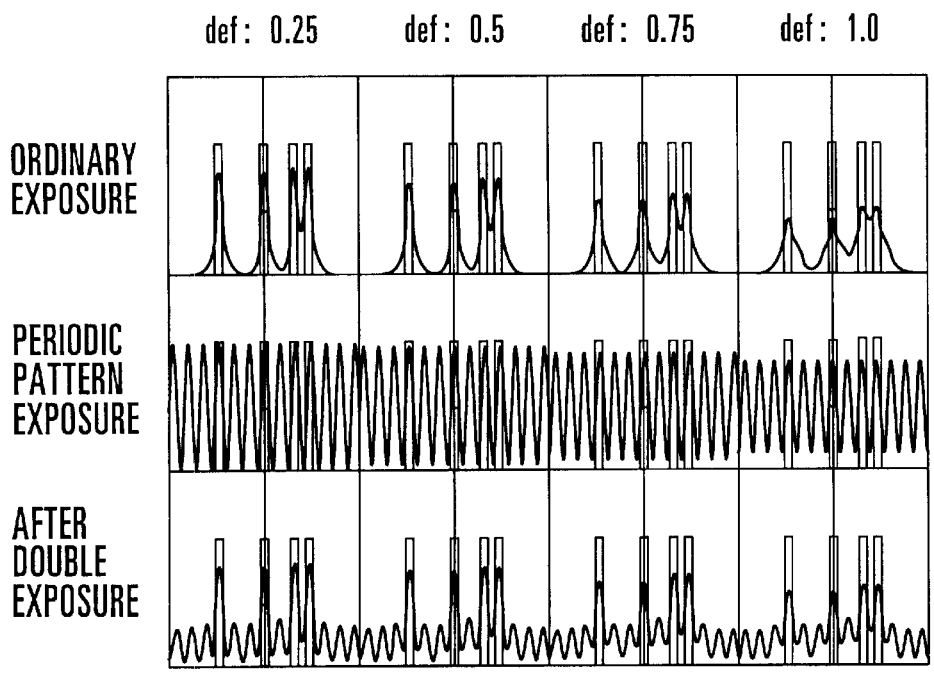

MULTIPLE EXPOSURE METHOD

BACKGROUND OF THE INVENTION

1. Field of the Invention

The present invention relates to an exposure method and an exposure apparatus, and more particularly to an exposure method and an exposure apparatus for exposing a photosensitive substrate to light with a minute circuit pattern. The exposure method and the exposure apparatus according to the invention are adapted for the manufacture of various devices such as semiconductor chips like an IC and an LSI, a display element like a liquid crystal panel, a detecting-element like a magnetic head, an image pickup element like a CCD, etc.

2. Description of Related Art

In the manufacture of an IC, and LSI, a liquid crystal element and the like devices by photolithography, a projection exposure method and a projection exposure apparatus are used to carry out exposures by projecting, through a projection optical system, a circuit pattern of a photomask, a reticle or the like (hereinafter referred to as a mask) onto a photosensitive substrate, such as a silicon wafer or glass plate, coated with a photoresist or the like (hereinafter referred to as a wafer).

It is a general trend to increase the rate of integration of the above-stated devices. To meet this trend, the pattern to be transferred to the wafer is required to be more minutely and finely prepared for a higher degree of resolution and the area of each chip on the wafer is required to be increased. Therefore, the projection exposure method or the projection exposure apparatus which is most important in the art of finely and minutely processing the wafer is now under the efforts of making it possible to form, over a wider area, an image measuring not greater than 0.5 μm in line width for the purpose of an improvement in resolution and in exposure area.

FIG. 18 schematically shows the arrangement of a projection exposure apparatus conventionally employed. In FIG. 18, there are illustrated an excimer laser 191 used as a light source for a far-ultraviolet ray exposure, an illumination optical system 192, illumination light 193, a mask 194, object-side exposure light 195 which comes from the mask 194 to be incident on an optical system 196, the optical system 196 which is a demagnifying projection optical system, image-side exposure light 197 which comes from the optical system 196 to be incident on a photosensitive substrate 198, the photosensitive substrate 198 which is a wafer, and a substrate stage 199 which is arranged to hold and carry the photosensitive substrate 198.

A laser beam emitted from the excimer laser 191 is led to the illumination optical system 192 by a delivery optical system. The laser beam is adjusted and converted by the illumination optical system 192 into the illumination light 193 having a light intensity distribution, a luminous distribution, an opening angle (a numerical aperture NA), etc., which are predetermined. The mask 194 is thus illuminated by the illumination light 193.

A minute and fine pattern to be eventually formed on the wafer 198 is beforehand formed on the mask 194 with chromium or the like applied to a quartz substrate. The minute pattern is formed in a size measuring a reciprocal number of times (two, four or five times) as much as the projection magnification of the projection optical system 196. The incident illumination light 193 passes and is diffracted through the minute pattern of the mask 194 to become the object-side exposure light 195. The projection optical system 196 converts the object-side exposure light 195 into the image-side exposure light 197 to image the minute circuit pattern on the wafer 198 at the predetermined projection magnification and with sufficiently small aberrations. As shown in an enlarged view at the lower part of FIG. 18, the image-side exposure light 197 then converges on the wafer 198 at the predetermined numerical aperture NA (=sin θ) to form an image of the minute pattern on the wafer 198. In a case where the minute pattern is to be formed in a plurality of shot areas (to be used for one or a plurality of chips) of the wafer 198 one after another, the substrate stage 199 is moved step by step along the image plane of the projection optical system 196 to vary the relative positions of the wafer 198 and the projection optical system 196.

However, with the projection exposure apparatus which is generally arranged to use an excimer laser as a light source as described above, it is difficult to form a pattern of a line width not greater than 0.15 μm.

The attainable resolution of the projection optical system 196 is limited by a trade-off between the optical resolution and the depth of focus due to the wavelength of exposure light used for an exposure. The resolution R of a pattern resolvable by the projection exposure apparatus and the depth of focus DOF are expressed by the following Rayleigh's formulas (1) and (2):

$$R = k_1(\lambda/NA) \quad (1)$$

$$DOF = k_2(\lambda/NA^2) \quad (2)$$

where "λ" is the wavelength of the exposure light, "NA" is a numerical aperture on the image side indicating the brightness of the projection optical system 196, "$k_1$" and "$k_2$" are constants which are determined by the characteristic of a developing process for the wafer 198, etc., and are normally within a range from 0.5 to 0.7.

According to the formulas (1) and (2), the value of resolution R may be made smaller, for a higher degree of resolution, by making the numerical aperture NA larger. In actually carrying out an exposure, however, the depth of focus DOF of the projection optical system 196 must be at least at a certain value. This requirement imposes some limitation on the possible increase of the numerical aperture NA. It is thus apparent that the numerical aperture NA cannot be increased beyond the limit. It is also apparent that, in order to improve the resolution, the wavelength λ of the exposure light must be shortened.

The efforts to shorten the wavelength, however, encounter a serious problem. This problem lies in the difficulty of finding an optical material suitable for the lenses of the projection optical system 196. Most of known optical materials have their transmission factors close to zero in the far ultraviolet region. Although there is some fused quartz material manufactured as an optical material to have an exposure wavelength of about 248 nm for an exposure apparatus, the transmission factor of the fused quartz material abruptly drops for the exposure wavelengths not greater than 193 nm. It is thus extremely difficult to obtain an optical material actually usable for the region of exposure wavelengths not greater than 150 nm corresponding to the minute pattern of line width not greater than 0.15 μm. Besides, any glass material that is to be used for the region of far ultraviolet rays must meet various requirements other than the transmission factor. The requirements include durability, the uniformity of refractive index, optical strain, workability and so on. Such being the requirements, the availability of any optical material that is practically usable is in doubt.

As mentioned above, in order to form on the wafer 198 a pattern not greater than 0.15 μm in line width, the conventional method and apparatus for a projection exposure necessitate a reduction in exposure-light wavelength at least down to 150 nm or thereabout. However, there is no optical material usable for such a wavelength region. Therefore, it has been impossible to form on the wafer 198 any pattern that is not greater than 0.15 μm in line width.

A method for forming a minutely fine pattern by making a two-light-flux interference exposure has been disclosed in U.S. Pat. No. 5,415,835. According to the two-light-flux interference exposure, a pattern of line width not greater than 0.15 μm can be formed on the wafer.

FIG. 14 shows the principle of the method for the two-light-flux interference exposure. Referring to FIG. 14, a laser 151 emits a laser beam composed of coherent parallel light fluxes. The laser beam is divided into two light fluxes by means of a half mirror 152. The two light fluxes are respectively reflected by flat-surface mirrors 153 to cause two laser beams, i.e., the two coherent parallel light fluxes, to cross each other at an angle larger than zero and less than 90 degrees in such a way as to form interference fringes at a part where the two laser beams intersect each other. A wafer 154 is exposed to light with the interference fringes which give a light intensity distribution to form on the wafer 154 a minute periodic pattern according to the light intensity distribution of the interference fringes.

In a case where the two light fluxes intersect each other on the surface of the wafer in a state in which they are slanting to equal angles in opposite directions relative to a line perpendicular to the wafer surface, a degree of resolution R obtained by the two-light-flux interference exposure can be expressed by the following formula (3):

$$R=\lambda/(4 \sin \theta)=\lambda/4NA=0.25 \ (\lambda/NA) \quad (3)$$

where the resolution R represents the width of each of lines and spaces (L&S), i.e., the width of each of bright and dark bands of the interference fringes, θ represents the angle of incidence (absolute value) of the two light fluxes on the image plane of the wafer, and NA represents a value of sin θ.

Comparing the formula (1) which is for the resolution obtained by the ordinary projection exposure and the formula (3) which is for the resolution obtained by the two-flight-flux interference exposure, the resolution R obtained by the two-flight-flux interference exposure corresponds to a case where the constant $k_1$ is set to "0.25" in the formula (1). In other words, the resolution obtainable by the two-light-flux interference exposure is at least twice as high as the resolution obtained by the ordinary projection exposure which has the constant $k_1$ at a value between 0.5 and 0.7.

Although not disclosed in the above-cited U.S. Pat. No. 5,415,835, in a case where the value of NA is 0.6 at λ=0.248 nm (KrF excimer), the resolution R of 0.10 μm can be obtained by the two-light-flux interference exposure.

However, according to the method of the two-light-flux interference exposure, it is basically possible to obtain only a simple stripe pattern corresponding to the light intensity distribution of the interference fringes (exposure-amount distribution), and it is, therefore, impossible to form a circuit pattern on the wafer.

To solve this problem, the above-cited U.S. Pat. No. 5,415,835 has also disclosed another exposure method. According to that exposure method, a simple stripe pattern (periodic pattern), i.e., a binary exposure-amount distribution, is first applied to a resist of a wafer by the two-light-flux interference exposure. After that, without developing the wafer, an isolated line pattern is obtained on the wafer by applying another binary exposure-amount distribution to the wafer by carrying out an ordinary lithography (exposure) through a mask having apertures of a size which is within a range of the resolving power of an exposure apparatus.

However, according to the exposure method of the above-cited U.S. Pat. No. 5,415,835, also, it has been impossible to obtain a circuit pattern in a more complex shape as desired.

Further, in the above-cited U.S. Pat. No. 5,415,835, although the combination of the two-light-flux interference exposure and the ordinary exposure is disclosed, no practicable arrangement of an exposure apparatus capable of carrying out the combined exposure processes, i.e., a multiple exposure, is disclosed.

In the multiple exposure, an exposure shot of a periodic pattern and that of an ordinary pattern are either serially made or repeated for several times without carrying out any developing process between these exposure shots.

The periodic pattern exposure gives a larger depth of focus. Theoretically, the depth of focus of the interference fringes obtainable by causing two coherent light fluxes to interfere with each other is infinite. However, the depth of focus becomes finite in actuality, because the two light fluxes are caused to interfere with each other by using light which is coherent only in part due to problems relative to the exposure apparatus.

Meanwhile, projection exposure apparatuses which are popularly used for ordinary exposures have come to have an extremely shallow depth of focus as a result of a recent trend of increasing the numerical aperture NA. Besides, in a case where the mask (reticle) to be used for the ordinary exposure is arranged to have a pattern of such a minute size that is beyond the limit of a resolving power, such an apparatus has still shallower depth of focus.

A pattern minutely arranged beyond the limit of a resolving power can be made to be resolvable by carrying out a multiple exposure by superposing a periodic pattern exposure of a large depth of focus on an ordinary exposure of a small depth of focus.

However, since the depth of focus of the ordinary exposure is intrinsically small, a composite pattern image obtained by the multiple exposure gives a depth of focus which is smaller than a depth of focus obtainable by the periodic pattern exposure. In other words, it has been a problem that the advantageous depth of focus of the periodic pattern exposure obtainable by a known phase shifting method is not fully utilized by the conventional multiple exposure method.

A method for increasing the depth of focus has been developed, as disclosed in Japanese Laid-Open Patent Application No. SHO 63-42122. According to that method, without carrying out the multiple exposure by combining an ordinary exposure with a periodic pattern exposure, an ordinary exposure is made first at an in-focus (best focus) position and another ordinary exposure is made while defocusing the pattern in a positive direction. After that, a further ordinary exposure is made while defocusing the pattern in a negative direction.

Another multiple exposure method for increasing the depth of focus has been developed, as disclosed in Japanese Laid-Open Patent Application No. HEI 2-244708, in which several shots of exposure are carried out while varying the wavelength of exposure light.

A further method for increasing the depth of focus has been developed likewise, as disclosed in Japanese Laid-Open Patent Application No. HEI 4-277612 in respect of a projection exposure apparatus of the step-and-scan type.

However, it is still difficult to resolve a pattern below the limit of resolution "$k_1 \leq 0.5$" simply in accordance with the multiple exposure method of varying the defocus position alone. Further, in this case, the contrast of a defocused image is lowered by an averaging effect of the multiple exposure. Then, the pattern image might not be resolved as it fails to reach a contrast level necessary for resolving images on the resist in use.

BRIEF SUMMARY OF THE INVENTION

It is an object of the invention to provide a method and an apparatus capable of forming a complex pattern on a photosensitive material by carrying out thereon a multiple exposure including two exposures, i.e., for example, a periodic pattern exposure for resolving minute lines and an ordinary exposure for exposure with a device pattern.

It is another object of the invention to provide a method and an apparatus capable of obtaining a circuit pattern of a line width not greater than 0.15 μm.

To attain the above objects, in accordance with an aspect of the invention, there is provided a multiple exposure method comprising a step of exposing a photosensitive material with a first pattern having a periodic pattern, and a step of exposing the photosensitive material with a second pattern different from the first pattern by using a projection optical system, wherein the step of exposing the photosensitive material with the second pattern is performed in each of a plurality of positions of the photosensitive material in an optical axis direction of the projection optical system relative to a focus position of an image of the second pattern, and wherein a desired pattern is formed in the photosensitive material by a multiple exposure including the step of exposing the photosensitive material with the first pattern and the step of exposing the photosensitive material with the second pattern.

Further, in the multiple exposure method, the periodic pattern of the first pattern includes a multiplicity of minute lines composed of light-blocking parts or non-light-blocking parts (light-transmitting parts) or boundaries of phases (preferably, boundaries on both sides of which phases of light beams become "0" and "π"), an exposure with lines of at least a part of the multiplicity of minute lines is performed on the same position of the photosensitive material as a minute portion of the second pattern, and each of respective amounts of exposure for the lines of at least a part of the multiplicity of minute lines and the minute portion of the second pattern is so set as not to exceed a threshold value of the photosensitive material.

Further, in the multiple exposure method, an amount of exposure for a portion different from the minute portion of the second pattern is so set as to exceed the threshold value of the photosensitive material.

Further, in the multiple exposure method, the minute portion is a portion having a minimum line width among portions of the second pattern.

Further, in the multiple exposure method, a line width of each of the multiplicity of minute lines of the first pattern is substantially equal to a line width of the minute portion of the second pattern.

Further, in the multiple exposure method, a pitch of lines and spaces of the multiplicity of minute lines of the first pattern is equal to or less than a pitch of lines and spaces of the minute portion of the second pattern.

Further, in the multiple exposure method, the plurality of positions of the photosensitive material in the optical axis direction of the projection optical system relative to the focus position of the image of the second pattern are obtained by using a lens system producing chromatic aberration in the projection optical system to form a plurality of exposure light beams having respective different wavelengths.

Further, in the multiple exposure method, the plurality of positions of the photosensitive material in the optical axis direction of the projection optical system relative to the focus position of the image of the second pattern are obtained by displacing, in the optical axis direction, the photosensitive material or a mask on which the second pattern is formed.

Further, in the multiple exposure method, the plurality of positions of the photosensitive material in the optical axis direction of the projection optical system relative to the focus position of the image of the second pattern are obtained by scanning, in a direction perpendicular to the optical axis direction, a mask on which the second pattern is formed and, in synchronism with the mask, scanning the photosensitive material in a direction not perpendicular to the optical axis direction.

In accordance with another aspect of the invention, there are provided an exposure apparatus having an exposure mode of executing the multiple exposure method, and a method for manufacture of a device, comprising a process of exposing a resist of a wafer with a device pattern in accordance with the multiple exposure method, and a process of developing the exposed wafer.

In accordance with a further aspect of the invention there is provided an exposure method for performing a periodic pattern exposure in which an exposure is performed with a periodic pattern and a projection exposure in which an exposure is performed by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, the exposure method being characterized in that the projection exposure is performed while varying a relationship in position in an optical axis direction of a projection optical system between an image forming plane of the projection optical system and an exposure area.

In accordance with a further aspect of the invention, there is provided an exposure method for performing a periodic pattern exposure in which an exposure is performed with a periodic pattern and a projection exposure in which an exposure is performed by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, the exposure method being characterized in that the projection exposure is performed while varying a relationship in position in an optical axis direction of a projection optical system between an image forming plane of the projection optical system and an exposure area, and that an interval of a plurality of positions of the exposure area relative to the image forming plane is set to a value not greater than a value obtained by dividing a depth of focus in the periodic pattern exposure by n−1 where n is the number of the plurality of positions.

In accordance with a further aspect of the invention, there is provided an exposure method for performing a periodic pattern exposure in which an exposure is performed with a periodic pattern and a projection exposure in which an exposure is performed through a projection optical system by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, the exposure method being characterized in that the projection exposure includes a plurality of exposures which are serially performed respectively with a plurality of light beams of wavelengths including a light beam of wavelength shorter than a reference wavelength and a light beam of wavelength longer than the reference wavelength without performing a developing process between the plurality of exposures.

In accordance with a further aspect of the invention, there is provided an exposure method for performing a periodic pattern exposure in which an exposure is performed with a periodic pattern and a projection exposure in which an exposure is performed through a projection optical system by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, the exposure method being characterized in that the projection exposure includes a plurality of exposures which are serially performed respectively with a plurality of light beams of wavelengths including a light beam of wavelength shorter than a reference wavelength and a light beam of wavelength longer than the reference wavelength without performing a developing process between the plurality of exposures, and that a difference between best focus positions obtained by the light beam of shorter wavelength and the light beam of longer wavelength used for the projection optical system is within a depth of focus of the periodic pattern.

Further, in the exposure method, where the plurality of exposures are n exposures and a wavelength difference between the longer wavelength and the shorter wavelength is represented by $\lambda d$, the n exposures are performed while varying a wavelength width $\Delta\lambda$ as much as $\Delta\lambda = \lambda d /(n-1)$ In accordance with a further aspect of the invention, there is provided an exposure method for performing a periodic pattern exposure in which an exposure is performed with a periodic pattern and a projection exposure in which an exposure is performed through a projection optical system by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, the exposure method being characterized in that the projection exposure is performed by relatively scanning the mask and a photosensitive substrate onto which to project the pattern of the mask, and that the photosensitive substrate is inclined in a scanning direction with respect to a best focus plane of the projection optical system.

Further, in the exposure method, the following condition is satisfied:

$S \times \tan\theta < D$ where S is a length in the scanning direction of a total exposure range by the scanning exposure, $\theta$ is an angle of inclination of the photosensitive substrate relative to the best focus plane, and D is a depth of focus of the periodic pattern.

Further, in the exposure method, a period of the periodic pattern on the image forming plane of the projection optical system is twice or approximately twice as much as a value obtained by reducing a minimum line width of the pattern of the mask on an exposure plane.

Further, in the exposure method, the periodic pattern exposure and the projection exposure are performed in such a manner that a peak of light intensity distribution of one pattern portion of the periodic pattern on the image forming plane of the projection optical system coincides or approximately coincides with the center of an image of a pattern portion of minimum line width of the pattern of the mask.

Further, in the exposure method, the projection exposure is performed by using exposure light having a center wavelength of not greater than 400 nm.

Further, in the exposure method, the exposure light is supplied by one of a KrF excimer laser, an ArF excimer laser and an F2 excimer laser.

In accordance with a further aspect of the invention, there is provided an exposure apparatus having an exposure mode of performing an exposure in accordance with the exposure method.

Further, the exposure apparatus comprises a position alignment apparatus capable of causing a peak of light intensity distribution of one pattern portion of the periodic pattern on an image forming plane of the projection optical system to coincide or approximately coincide with the center of an image of a pattern portion of a minimum line width of the pattern of the mask.

In accordance with a further aspect of the invention, there is provided a method for manufacture of a device, comprising a process of transferring a device pattern of a mask to a photosensitive substrate in accordance with the exposure method.

Further, in the exposure method and the exposure apparatus in accordance with a further aspect of the invention, the periodic pattern exposure is composed of one or a plurality of exposure steps. In the case of a plurality of exposure steps, an exposure amount distribution made on a photosensitive substrate by the periodic pattern exposure varies with the exposure step.

Further, in the exposure method and the exposure apparatus, either of the periodic pattern exposure or the ordinary exposure may be made prior to the other or these exposures may be simultaneously made.

Further, in the exposure method and the exposure apparatus, the wavelength of exposure light in the case of the projection exposure is not greater than 400 nm, for example, 365 nm (i-line), or, preferably, not greater than 250 nm. To obtain the exposure light wavelength of not greater than 250 nm, a KrF excimer laser (wavelength of about 248 nm), an ArF excimer laser (wavelength of about 193 nm) or an F2 excimer laser (wavelength of about 157 nm) is employed.

The term "projection exposure" as used in the present specification means an exposure to be made with at least three parallel light fluxes coming from an arbitrary pattern formed on a mask to be incident on an image plane at various angles which differ from each other.

The exposure apparatus according to the invention has a projection optical system arranged to project a pattern of a mask on a wafer, and a mask illumination optical system arranged to illuminate the mask by making either selectively or simultaneously a partly coherent illumination of σ large a value, a coherent illumination and a partly coherent illumination of a small σ value. The exposure apparatus is thus arranged to make an ordinary exposure by using the partly coherent illumination and to make a periodic pattern exposure according to a two-light-flux interference exposure method by using the coherent illumination.

The term "partly coherent illumination" as used herein means an illumination having the value σ (="numerical aperture of the illumination optical system"/"numerical aperture of the projection optical system") at a value above zero and below "1". The term "coherent illumination" as used herein means an illumination having the value σ at a value at zero or near to zero, which is considerably smaller than that of the partly coherent illumination. For example, small σ values range from 0 to 0.3, and large σ values range from 0.5 to 0.8 or thereabout.

An exposure apparatus arranged according to the invention, in one aspect thereof, comprises a two-light-flux interference exposure apparatus, an ordinary (projection) exposure apparatus, and a moving stage which is usable in common by both the two-light-flux interference exposure apparatus and the ordinary exposure apparatus and is arranged to hold an exposure substrate (photosensitive substrate). The wavelength of exposure light for use in the exposure apparatus is also not greater than 400 nm, for example, 365 nm (i-line), or, preferably, not greater than 250 nm. In order to obtain the light of exposure wavelength not greater than 250 nm, a KrF excimer laser (wavelength of about 248 nm), an ArF excimer laser (wavelength of about 193 nm) or an F2 excimer laser (wavelength of about 157 nm) is employed.

An exposure method according to the invention in one aspect thereof is arranged to define a pattern of resolution below the resolvable limit of $k_1 \leq 0.5$ ($k_1$ is a value obtained by normalizing the resolution R by the wavelength of exposure light and the numerical aperture) over a large depth of $k_2 > 0.7$ ($k_2$ is a value obtained by normalizing the depth of focus DOF by the wavelength of exposure light and the numerical aperture) and, in order to give a contrast resolvable on a resist (a recent high-resolution resist is capable of resolving, for example, at 40%), the resist is exposed to a high-contrast image (of a periodic pattern) which is further superposed after a defocus superposing exposure.

The above and other objects and features of the invention will become apparent from the following detailed description of preferred embodiments thereof taken in connection with the accompanying drawings.

BRIEF DESCRIPTION OF THE SEVERAL VIEWS OF THE DRAWING

FIGS. 2(A) and 2(B) show a periodic pattern (exposure pattern) which is obtained by a two-light-flux interference exposure.

FIGS. 3(A) and 3(B) show exposure sensitivity characteristics of resists.

FIG. 4 shows how a pattern is formed through a developing process.

FIG. 5 shows a periodic pattern (exposure pattern) obtained by an ordinary two-light-flux interference exposure.

FIGS. 8(A) and 8(B) show by way of example another exposure pattern (lithography pattern) which can be formed according to the first embodiment.

FIGS. 9(A) and 9(B) show by way of example a further exposure pattern (lithography pattern) which can be formed according to the first embodiment.

FIG. 21 schematically shows by way of example the arrangement of another high-resolution exposure apparatus according to the invention.

FIGS. 22(A) and 22(B) show how a multiple exposure is made by varying the surface height of a wafer in carrying out an ordinary projection exposure.

FIG. 29 shows advantageous effects attainable by the exposure method of the invention.

FIG. 30 shows advantageous effects attainable by the exposure method of the invention.

FIG. 31 shows an L/S wiring pattern obtained according to the invention.

FIG. 32 shows advantageous effects attainable by the exposure method of the invention.

FIG. 34 shows advantageous effects attainable by the exposure method of the invention.

DETAILED DESCRIPTION OF THE INVENTION

Hereinafter, preferred embodiments of the invention will be described in detail with reference to the drawings.

An exposure method according to a first embodiment of the invention is first described with reference to FIG. 1 to FIGS. 9(A) and 9(B).

Figure 1:
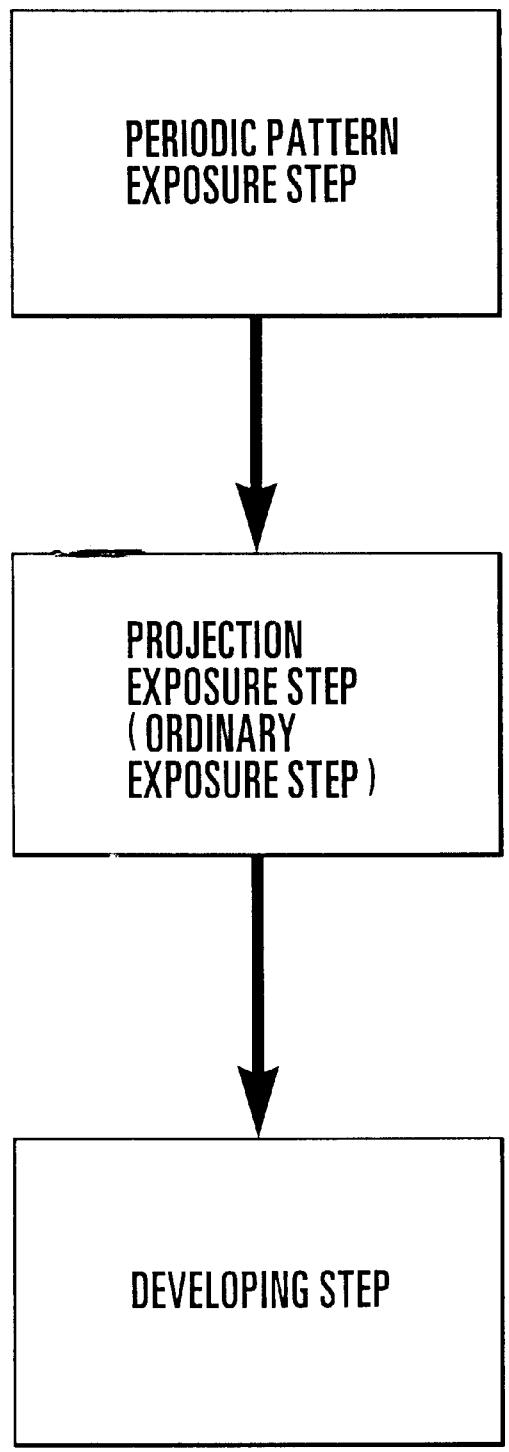
FIG. 1. is a flow chart showing the processes of an exposure method according to the invention.

FIG. 1 shows in a flow chart the exposure method according to the invention. As shown in FIG. 1, the exposure method includes a periodic pattern exposure step, a projection exposure step (ordinary exposure step), and a developing step. The sequence of the periodic pattern exposure step and the projection exposure step does not have to be the order shown in FIG. 1. The projection exposure step may be executed before the periodic pattern exposure step. In a case where each of the periodic pattern exposure step and the projection exposure step is to be executed a plurality of times, the periodic pattern exposure step and the projection exposure step may be alternately executed. Further, no developing process is inserted between the periodic pattern exposure step and the projection exposure step, but some precise alignment step, etc., may be inserted in between the periodic pattern exposure step and the projection exposure step. However, such steps are omitted in FIG. 1. The periodic pattern exposure step is executed, for example, by a two-light-flux interference exposure method.

In a case where an exposure is to be carried out according to the flow of FIG. 1, a wafer, i.e., a photosensitive substrate, is first exposed by the periodic pattern exposure step with a periodic pattern which is, for example, as shown in FIG. 2(A). In FIG. 2(A), numerals indicate the amounts of exposure. The amount of exposure of each of hatched parts is "1" (variable as desired in actuality), while that of each of white parts is "0".

In developing only the periodic pattern after a resist of a photosensitive substrate is exposed with the periodic pattern, an exposure threshold value Eth of the resist of the photosensitive substrate is set to a value between "0" and "1" as shown in a graph in the lower part of FIG. 2(B). The upper part of FIG. 2(B) shows a lithography pattern (relief-and-intaglio pattern) which is to be eventually obtained as a final pattern.

FIGS. 3(A) and 3(B) respectively show the dependency on the exposure amount of the film thickness after development and the exposure threshold value of a negative resist and those of a positive resist applied to the photosensitive substrate. The film thickness "d" after development becomes "0" where the exposure is made to an exposure amount above the exposure threshold value Eth in the case of the positive resist and where the exposure is made to an exposure amount less than the threshold value Eth in the case of the negative resist.

FIG. 4 schematically shows, for each of the negative and positive resists, how a lithography pattern is formed through developing and etching processes after the above-stated exposure.

Figure 6:
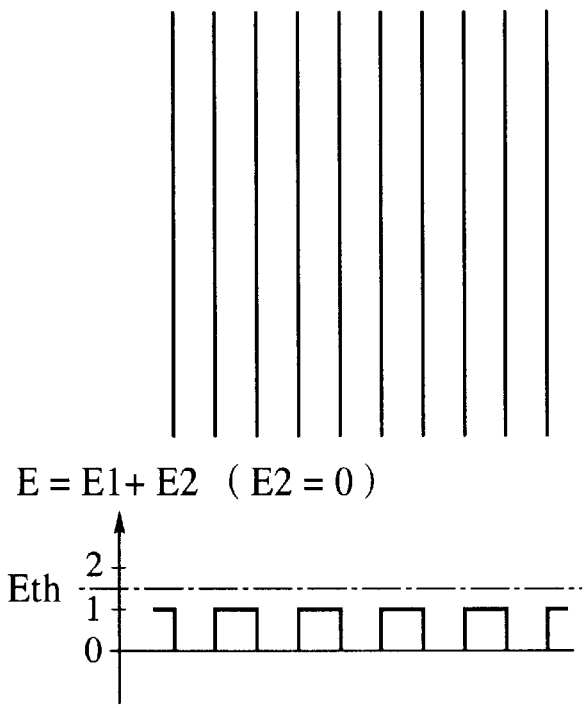
FIG. 6 shows a periodic pattern (exposure pattern) obtained by a two-light-flux interference exposure according to the invention.

Unlike the above ordinary exposure sensitivity setting, the first embodiment sets the exposure threshold value Eth of the resist of the photosensitive substrate to a value larger than "1" when a maximum exposure amount by the periodic pattern exposure (two-light-flux interference exposure) is assumed to be "1", as shown in FIG. 5 (the same figure as FIG. 2(A)) and FIG. 6.

The exposure amount for this photosensitive substrate becomes insufficient in a case where an exposure pattern, i.e., an exposure amount distribution, obtained solely with the periodic pattern exposure as shown in FIG. 5 is developed. In such a case, although the film thickness somewhat varies, the film thickness after development does not become "0" at any part and it is hardly possible to obtain any lithography pattern by etching. The periodic pattern then can be considered to have disappeared. The following description is given on the assumption of using the negative resist. However, the invention is of course not limited to the use of the negative resist. The positive resist also can be used in accordance with the invention.

In FIG. 6, an upper part thereof shows a lithography pattern (no pattern formed). A lower part of FIG. 6 shows in a graph the exposure threshold value in relation to an exposure amount distribution. In the lower part of FIG. 6, "$E_1$" represents an exposure amount obtained by the periodic pattern exposure, and "$E_2$" represents an exposure amount obtained by the ordinary projection exposure.

An advantageous feature of the exposure method for use in the first embodiment lies in the following point. A high-resolution first exposure pattern which is composed of a multiplicity of minute lines and which seems to disappear if it is processed by the periodic pattern exposure alone is merged with a second exposure pattern obtained by the ordinary projection exposure in an arbitrary shape including a pattern of a size less than the resolving power of the exposure apparatus (if necessary, is merged also with a third exposure pattern). Then, only desired areas of the substrate are selectively exposed at values above the exposure threshold value of the resist. By virtue of these processes, a final lithography pattern can be formed as desired.

Figure 7A:
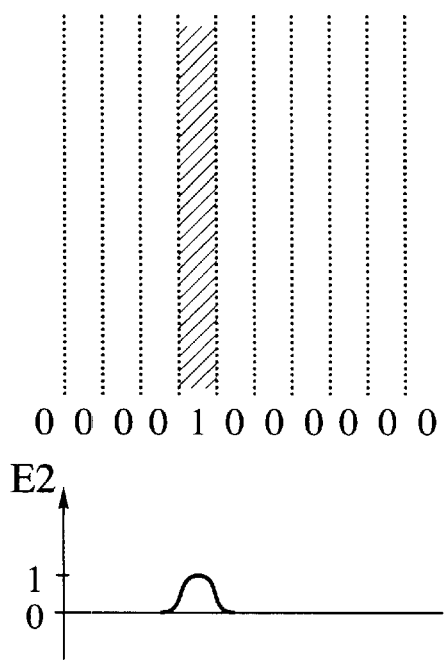
FIGS. 7(A) and 7(B) show by way of example an exposure pattern (lithography pattern) which can be formed according to a first embodiment of the invention.

FIG. 7(A) shows an exposure pattern, i.e., an exposure amount distribution, obtained by the ordinary projection exposure. This pattern is composed of minute parts smaller than the resolving power of the exposure apparatus. Therefore, the minute parts remain unresolved and an exposure intensity distribution is blurred and spread.

In the case of the first embodiment, a minute pattern is formed to have a line width which is about one half of the resolution of the ordinary projection exposure.

Figure 7B:
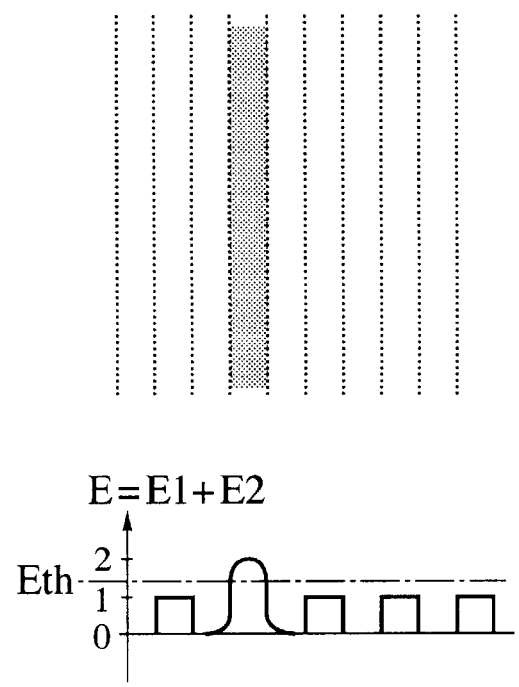

If a projection exposure which forms the exposure pattern of FIG. 7(A) is superposed on one and the same area of the same resist after the periodic pattern exposure of FIG. 5 without carrying out any developing process, a total exposure amount distribution on the resist becomes as shown in a graph in the lower part of FIG. 7(B). In this instance, the exposure amount $E_1$ of the periodic pattern exposure and the exposure amount $E_2$ of the projection exposure (ordinary exposure) are in a ratio of 1:1. The exposure threshold value Eth of the resist is set to a value between the exposure value $E_1$ (=1) and a sum "$E_1+E_2$" (=2) of the exposure value $E_1$ and the exposure value $E_2$ of the projection exposure. Therefore, a lithography pattern as shown in the upper part of FIG. 7(B) is formed. In that instance, the center of the exposure pattern of the ordinary projection exposure is set to coincide with a peak of the exposure pattern of the periodic pattern exposure. An isolated line pattern shown in the upper part of FIG. 7(B) has the resolution of the periodic pattern exposure and gives no simple periodic pattern. Therefore, it becomes possible to obtain a pattern of such a high resolution that is hardly attainable by the ordinary projection exposure alone.

FIG. 8(A) shows a case where a projection exposure is carried out with a pattern of a line width twice as large as the above-stated line width and at an exposure amount which is above the exposure threshold value Eth (an exposure amount two times as much as the value Eth in this case). Then, the exposure pattern shown in FIG. 8(A) is superposed on the periodic pattern exposure of FIG. 5 on one and the same area of the same resist without performing any developing process after the periodic pattern exposure of FIG. 5 is made. At that time, the superposed patterns are allowed to be adequately symmetric to give an excellent image by causing the center of the exposure pattern of the ordinary exposure to coincide with a peak of the exposure pattern of the periodic pattern exposure. A total exposure amount distribution on the resist becomes as shown in FIG. 8(B). Thus, an exposure pattern of the two-light-flux interference exposure disappears and only an exposure pattern of the projection exposure is eventually left. Accordingly, when a developing process is carried out, there is formed only a lithography pattern corresponding to the exposure pattern of the projection exposure.

FIG. 9(A) shows a case where an exposure is carried out with a pattern of line width three times as large as the line width of the exposure pattern of FIG. 5. The effect obtainable in this case is the same as in the case of FIGS. 8(A) and 8(B). In a case where an exposure pattern has a line width four times or more than four times as large as the line width of the exposure pattern of FIG. 5, since the exposure is made basically by combining an exposure pattern of a double line width with an exposure pattern of a triple line width, the line width of a lithography pattern to be eventually obtained is self-evident from the combination. All the lithography patterns that are obtainable by the projection exposure can be formed also in the first embodiment.

According to the exposure method, the exposure amount distributions (in absolute values as well as states of distribution) obtainable respectively by the periodic pattern exposure and the projection exposure (ordinary exposure) and the threshold value of the resist of the photosensitive substrate are adjusted as briefly described above. By virtue of the adjustment, a circuit pattern can be formed to be composed of a combination of various patterns as shown in FIGS. 6, 7(B), 8(B) and 9(B) and to have its minimum line width become the resolution of the periodic pattern exposure as in the pattern of FIG. 7(B).

A recapitulation of the principle of the above-described exposure method is as follows.

(i) Any area of the periodic pattern exposure that is not merged with the exposure pattern of the ordinary exposure, i.e., any pattern area of the periodic pattern exposure that has an amount of exposure less than the exposure threshold value of the resist, is caused to disappear by a developing process.

(ii) As regards the pattern area where the exposure is made by the ordinary exposure at an exposure amount less than the exposure threshold value of the resist, an exposure pattern which is a part of a desired circuit pattern and which is determined by the combination of the exposure pattern of the ordinary exposure and that of the periodic pattern exposure is formed to have the resolution of the periodic pattern exposure.

(iii) In the area of the pattern at which an exposure is made by the ordinary exposure at an exposure amount above the exposure threshold value, there is formed an exposure pattern which corresponds to the pattern of the mask. Another advantage of such a multiple exposure method lies in that if the periodic pattern exposure, which has the highest resolving power, is carried out by using the two-light-flux interference exposure method, a large depth of focus can be obtained.

While the periodic pattern exposure has been described as to be performed before the projection exposure, the invention is not limited to this sequence.

Figure 10:
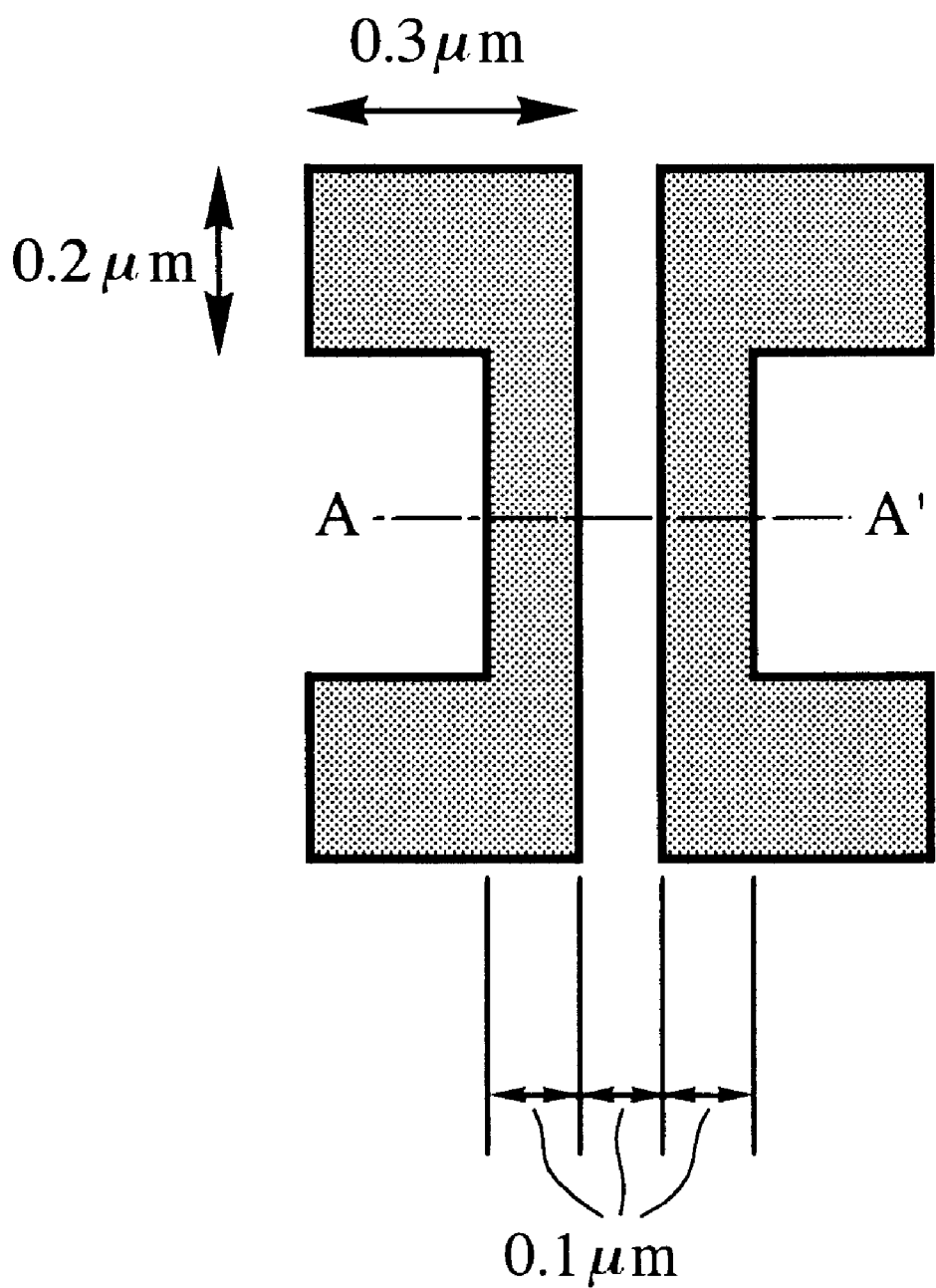
FIG. 10 shows a gate pattern.

The first embodiment is intended to obtain a circuit pattern (lithography pattern) called a gate pattern, which is shown by way of example in FIG. 10.

In the case of the gate pattern shown in FIG. 10, the minimum line width of the pattern measures 0.1 $\mu$m in the horizontal direction, i.e., in the direction of line A–A', and 2 $\mu$m or more in the vertical direction. According to the invention, in a case where a high resolution is required only in the one-dimensional direction of such a two-dimensional pattern, a periodic pattern exposure is carried out, for example, by the two-light-flux interference exposure process only in the one-dimensional direction in which a high degree of resolution is required.

Figures 11A, 11B, 11C:
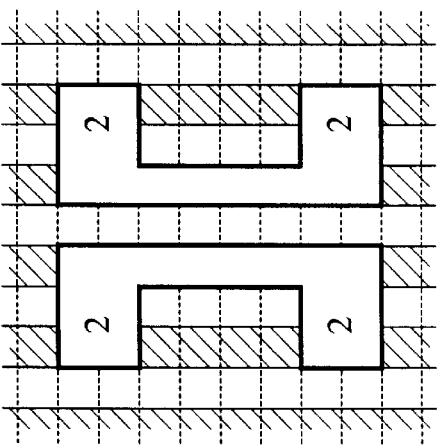
FIGS. 11(A), 11(B) and 11(C) show by way of example a multiple exposure to be made in the first embodiment.

FIGS. 11(A) to 11(C) show by way of example a case where the periodic pattern exposure only in the one-dimensional direction and the ordinary projection exposure are made in combination according to the first embodiment of the invention.

FIG. 11(A) shows a periodic exposure pattern to be formed by the two-light-flux interference exposure process only in the one-dimensional direction. In this case, the period of the periodic exposure pattern is 0.2 $\mu$m, and the periodic exposure pattern corresponds to an L&S pattern of line width 0.1 $\mu$m. Numerals shown in the lower part of FIG. 11(A) represent amounts of exposure.

Figure 14:
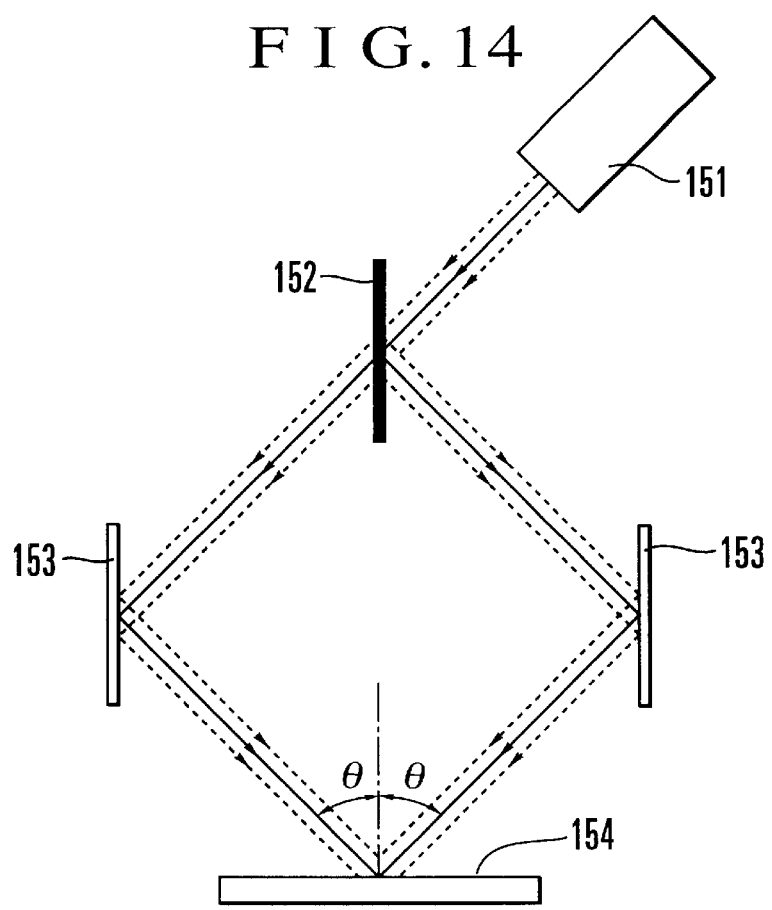
FIG. 14 schematically shows by way of example a two-light-flux interference exposure apparatus arranged to make a periodic pattern exposure.
Figure 15:
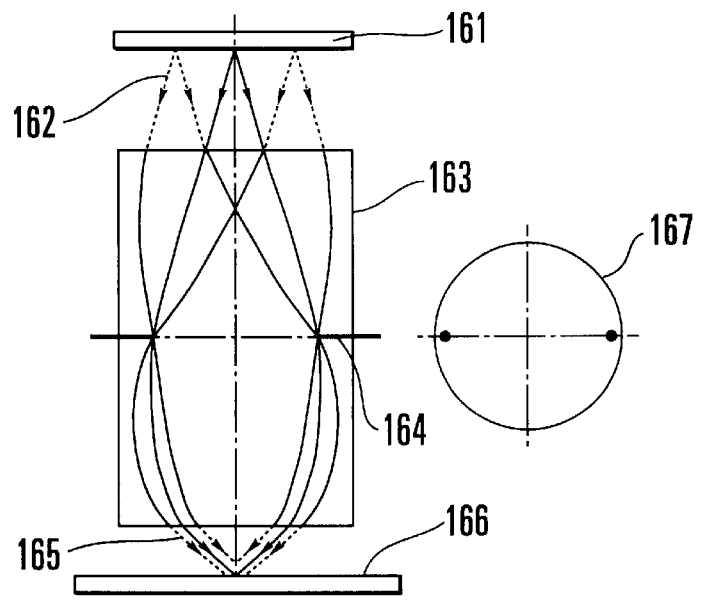
FIG. 15 schematically shows by way of example a projection exposure apparatus arranged to make a periodic pattern exposure by two-light-flux interference.
Figure 16A:
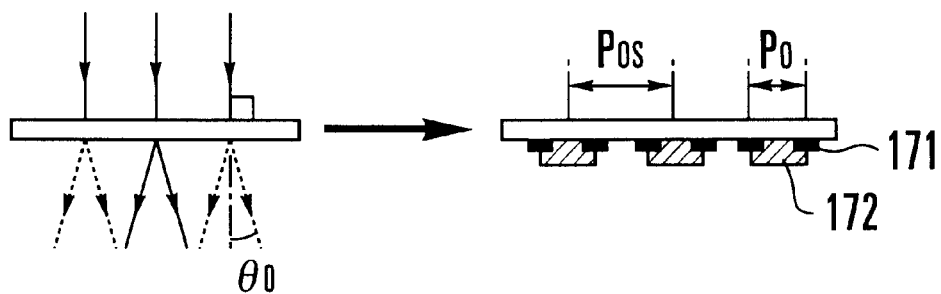
FIGS. 16(A) and 16(B) show by way of example a mask and an illumination method to be used for the exposure apparatus shown in FIG. 15.
Figure 16B:
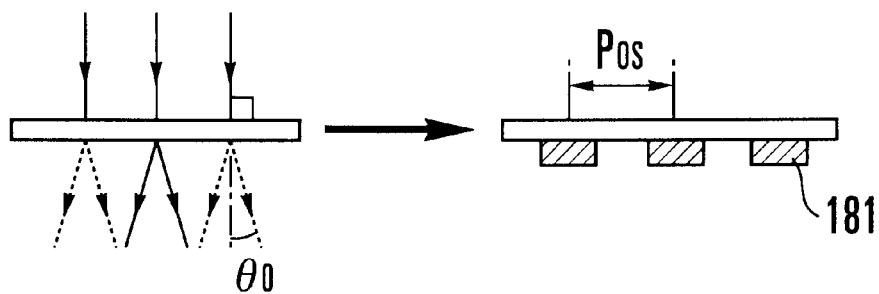
Figure 17:
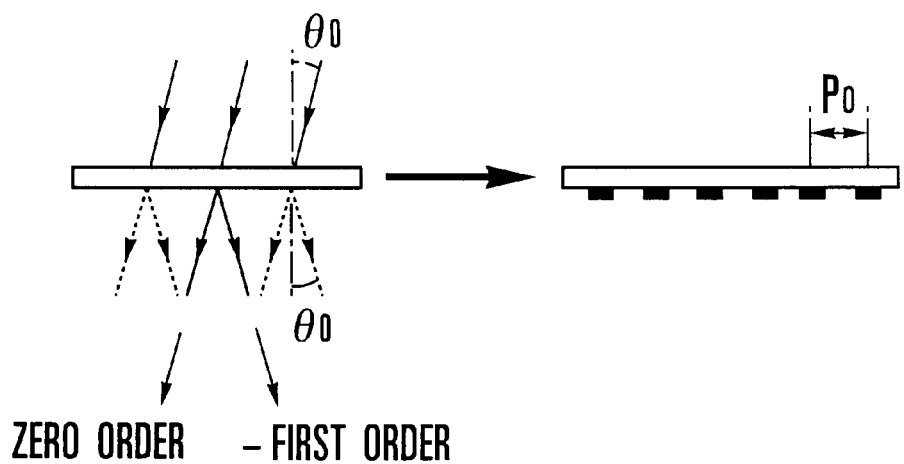
FIG. 17 shows as another example a mask and an illumination method to be used for the exposure apparatus shown in FIG. 15.

Exposure apparatuses capable of carrying out the two-light-flux interference exposure process include an apparatus having a wave-dividing-joining optical system of the interferometer type including a laser 151, a half mirror 152 and flat mirrors 153 as shown in FIG. 14, and a projection exposure apparatus which is shown in FIG. 15 and has a mask and an illumination method arranged as shown in FIGS. 16(A), 16(B) or 17.

The exposure apparatus which is shown in FIG. 14 is arranged as follows. Referring to FIG. 14, two light fluxes to be joined together come to obliquely fall on a wafer 154 respectively at an angle $\theta$ to form a interference fringe pattern (exposure pattern) on the wafer 154. The line width of the interference fringe pattern which is formed on the wafer 154 is as expressed by the formula (3) in the foregoing. The relation of the angle $\theta$ to the numerical aperture NA on the image side of the wave-dividing-joining optical system is expressed as "NA=sin $\theta$". The angle $\theta$ can be adjusted and set as desired by varying the angles of a pair of flat mirrors 153. The line width of each stripe of the interference fringe pattern becomes smaller when the angle $\theta$ of the pair of flat mirrors 153 is set to a larger value. For example, with the wavelength of the two light fluxes assumed to be 248 nm (KrF excimer laser beam), an interference fringe pattern having each of its stripes measuring about 0.1 $\mu$m in line width can be formed by setting the angle $\theta$ of the pair of flat mirrors 153 to 38 degrees. In this instance, the numerical aperture NA is 0.62 (=sin $\theta$). It goes without saying that a higher resolution can be obtained by setting the angle $\theta$ to a larger angle than 38 degrees.

Next, the exposure apparatus shown in FIGS. 15 to 17 is described. The exposure apparatus shown in FIG. 15 is a projection exposure apparatus using, for example, an ordinary demagnification projection optical system (composed of a large number of lenses). At present, some of apparatuses of this kind are arranged to have a numerical aperture NA of 0.6 or above for an exposure wavelength 248 nm.

In FIG. 15, there are illustrated a mask 161, object-side exposure light 162 which comes from the mask 161 to fall on a projection optical system 163, the projection optical system 163, an aperture stop 164, image-side exposure light 165 which comes from the projection optical system 163 to fall on a wafer 166, and the wafer 166 which is a photosensitive substrate. A part 167 of FIG. 15 shows, in a pair of black points, the positions of light fluxes on a pupil plane corresponding to a circular aperture of the stop 164. The projection exposure apparatus is schematically shown as in a process of making a two-light-flux interference exposure. Unlike in the case of the ordinary projection exposure shown in FIG. 18, each of the object-side exposure light 162 and the image-side exposure light 165 is composed of only two parallel light fluxes.

In order to make a two-light-flux interference exposure with an ordinary projection exposure apparatus such as that shown in FIG. 15, the mask and the illumination method are set in any of three different manners shown, by way of example, in FIGS. 16(A), 16(B) and 17. The three different examples are described below.

FIG. 16(A) shows a phase shifting mask of the Levenson type, which has a light-blocking part made of chromium at a pitch $P_o$ and a phase shifter 172 at a pitch $P_{os}$ as expressed in the following formulas (4) and (5):

$$P_o = P/M = \lambda/\{M(2NA)\} \quad (4)$$

$$P_{os} = 2P_o = \lambda/\{M(NA)\} \quad (5)$$

where M represents the projection magnification of the projection optical system 163, λ represents the wavelength of exposure light, NA represents the image-side numerical aperture of the projection optical system 163, and P represents the pitch of a periodic pattern image on the wafer 166 (image plane).

FIG. 16(B) shows a phase shifting mask of the shifter edge type, which has no light-blocking part made of chromium. Like in the case of the Levenson type mask, this phase shifting mask has the pitch $P_{os}$ of a phase shifter 181 arranged to satisfy the above formula (5).

In carrying out a two-light-flux interference exposure with the phase shifting mask shown in FIG. 16(A) or 16(B), it is ideal to have the mask illuminated by the so-called coherent illumination of "σ≈0". In actuality, however, a partly coherent illumination having a small a value of less than 0.3 or thereabout is used. More specifically, parallel light fluxes of a small NA value are applied to the mask perpendicularly to its surface, i.e., in the direction parallel to the optical axis.

With the illumination carried out in this manner, so long as a zero-order transmission diffracted light perpendicularly coming from the mask is concerned, there appears no phase difference between adjacent transmitted light fluxes as the phase shifter acts to cause the phase difference between the adjacent light fluxes to become σ, canceling the phase difference. Two parallel light fluxes of the ± first-order transmission diffracted light are generated by the mask symmetrically with respect to the optical axis of the projection optical system 163. Then, two image-side exposure light fluxes 165 shown in FIG. 15 come to interfere with each other on the wafer 166. Further, the second-order or higher-order diffracted light does not fall on the aperture of the aperture stop 164 of the projection optical system 163 and, therefore, does not contribute to the image formation.

A mask shown in FIG. 17 has a light blocking part made of chromium to have a pitch $P_o$ arranged to satisfy the following formula (6), which is similar to the formula (4):

$$P_o = P/M = \lambda/\{M(2NA)\} \quad (6)$$

where M represents the projection magnification of the projection optical system 163, λ represents the wavelength of exposure light, and NA represents the image-side numerical aperture of the projection optical system 163.

The mask shown in FIG. 17, which has no phase shifter, is arranged to be illuminated by one or two parallel light fluxes obliquely incident thereon. The angle of incidence $\theta_o$ of the parallel light fluxes on the mask is set to satisfy the following formula (7). In the case of using two parallel light fluxes, the mask is illuminated by the two parallel light fluxes which are aslant as much as the angle $\theta_o$ in opposite directions with respect to the optical axis.

$$\sin \theta_o = M \cdot NA \quad (7)$$

In the formula (7) also, M represents the projection magnification of the projection optical system 163, and NA represents the image-side numeral aperture of the projection optical system 163.

In the case of FIG. 17, when the mask having no phase shifter is illuminated by the obliquely incident illumination with the parallel light fluxes in a manner which satisfies the formula (7), two light fluxes are generated from the mask as two object-side exposure light fluxes 162 as shown in FIG. 15. One of the light fluxes is a zero-order transmission diffracted light flux which rectilinearly advances at the angle $\theta_o$ with respect to the optical axis. The other light flux is a—first-order transmission diffracted light flux which advances along an optical path symmetrical with the optical path of the zero-order diffracted light flux with respect to the optical axis of the projection optical system 163. These two light fluxes then come to fall on the aperture part of the aperture stop 164 of the projection optical system 163 to be imaged there.

According to the invention, such an oblique incidence illumination with one or two parallel light fluxes is considered also to be a "coherent illumination".

Figure 18:
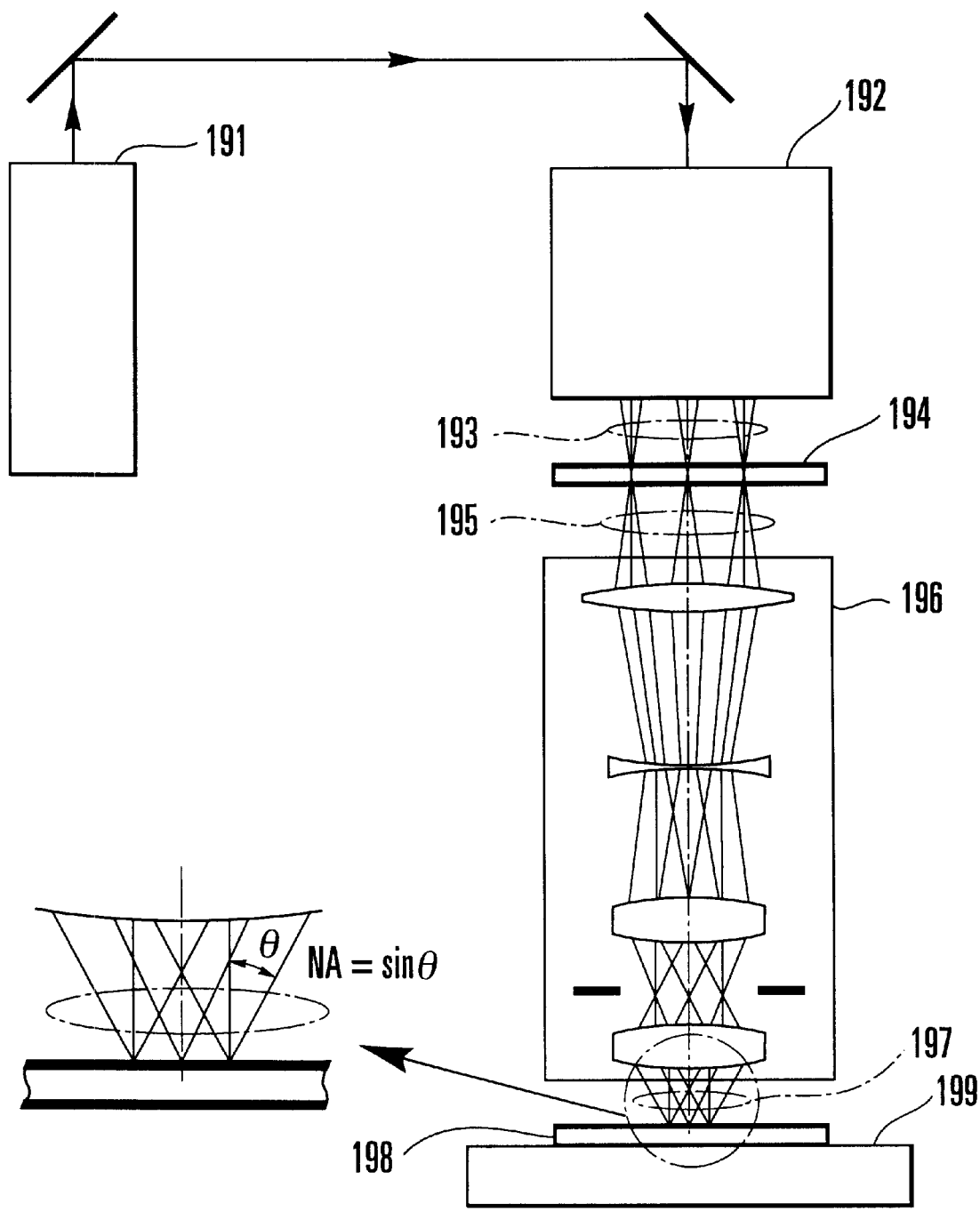
FIG. 18 schematically shows the arrangement of a conventional projection exposure apparatus.

A two-light-flux interference exposure can be carried out by an ordinary projection exposure apparatus in the manner as described above. FIG. 18 shows an ordinary projection exposure apparatus. In such an ordinary projection exposure apparatus, an illumination optical system is arranged to make a partly coherent illumination of a large σ value. Therefore, a projection exposure apparatus can be arranged to be capable of making either a substantially coherent illumination or a partly coherent illumination of a small σ value, for example, by replacing an aperture stop of the illumination optical system (not shown) which is adapted for σ=0.5 to 0.8 for an ordinary exposure with a special aperture stop adapted for σ=0 to 0.3.

The following resumes the description of the first embodiment referring again to FIG. 10 and FIGS. 11(A) to 11(C).

In the first embodiment, an exposure with a gate pattern shown in FIG. 11(B) is made. For this purpose, after a periodic pattern exposure is made by the two-light-flux interference exposure method, an ordinary projection exposure is made, for example, by applying a partly coherent illumination to the mask using an apparatus arranged as shown in FIG. 18. FIG. 11(B) shows, in its upper part, a positional relation to a periodic pattern:obtained by the two-light-flux interference exposure and the exposure amounts obtained in the areas of an exposure pattern of the ordinary projection exposure. The lower part of FIG. 11(B) shows exposure amounts obtained on the resist of the wafer by the ordinary projection exposure. The exposure amounts are shown in a map by resolving the pattern at a pitch of 0.1 μm in both the vertical and horizontal directions of the pattern.

The minimum line width parts of the exposure pattern obtained by the projection exposure remain unresolved and spread to have less amounts of exposure. Roughly speaking, the exposure amount of a pattern is large in the central area of the pattern and small in both side areas of the pattern. The exposure amounts on the central area and on the two side areas are indicated respectively as "a" and "b", while the exposure amount in the middle area where blurred images from the two minimum line width parts occur is indicated as "c". Since the exposure amount varies with the area of the pattern, a multivalued exposure amount distribution is obtained. Here, the individual exposure amounts are in the conditions of $1<a<2$, $0<b<1$ and $0<c<1$. In a case where the above mask is used, a ratio between exposure amounts obtained on the wafer (photosensitive substrate) by the above-stated exposures is as follows: "two-light-flux interference exposure":"projection exposure"=1:2.

FIG. 10 shows a minute circuit pattern which is obtained by the combination of the above-stated periodic pattern exposure and the ordinary projection exposure. The minute circuit pattern is formed in the following manner. According to the first embodiment, no developing process is performed between the periodic pattern exposure which is made by the two-light-flux interference exposure method and the ordinary projection exposure. Therefore, at each area where the exposure patterns of these exposures overlap each other, the exposure amount (distribution) of one exposure is added to that of the other exposure. A new exposure pattern is generated by the overlapped or superposed exposure amount distributions.

FIG. 11(C) shows, in its upper part, an exposure amount distribution (exposure pattern) obtained as a result of addition of the exposure amount of the exposure pattern of FIG. 11(A) and that of the exposure pattern of FIG. 11(B) to each other as mentioned above according to the first embodiment. The exposure amount of areas which are indicated as "e" is "1+a", which is a value greater than "2" and less than "3".

The lower part of FIG. 11(C) shows a developed pattern obtained after the above-stated pattern is subjected to a developing process. The developed pattern is indicated in gray. In the first embodiment, the resist used for the wafer has an exposure threshold value greater than "1" and less than "2". Therefore, only such parts where exposure amounts are greater than "1" appear in the pattern obtained through the developing process. The shape and dimensions of the gray pattern shown in the lower part of FIG. 11(C) coincides with those of the gate pattern shown in FIG. 10. This indicates that, according to the multiple exposure method of the invention, a circuit pattern which has such a minute line width that measures only 0.1 μm can be formed by using a projection exposure apparatus arranged to be capable of switching, for example, between a partly coherent illumination of a large σ value and a coherent illumination or a partly coherent illumination of a small σ value.

Figure 12:
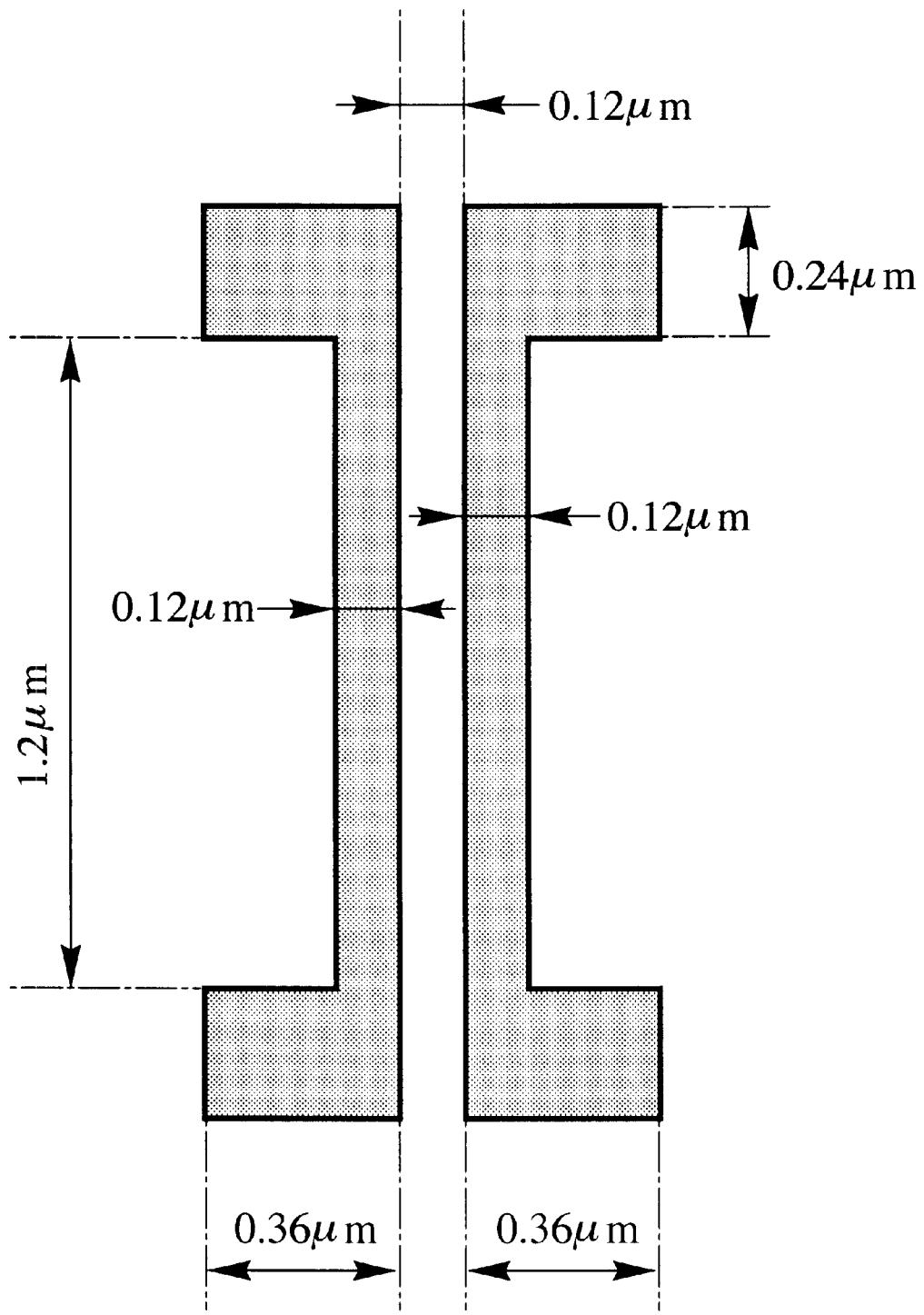
FIG. 12 shows a gate pattern.
Figure 13:
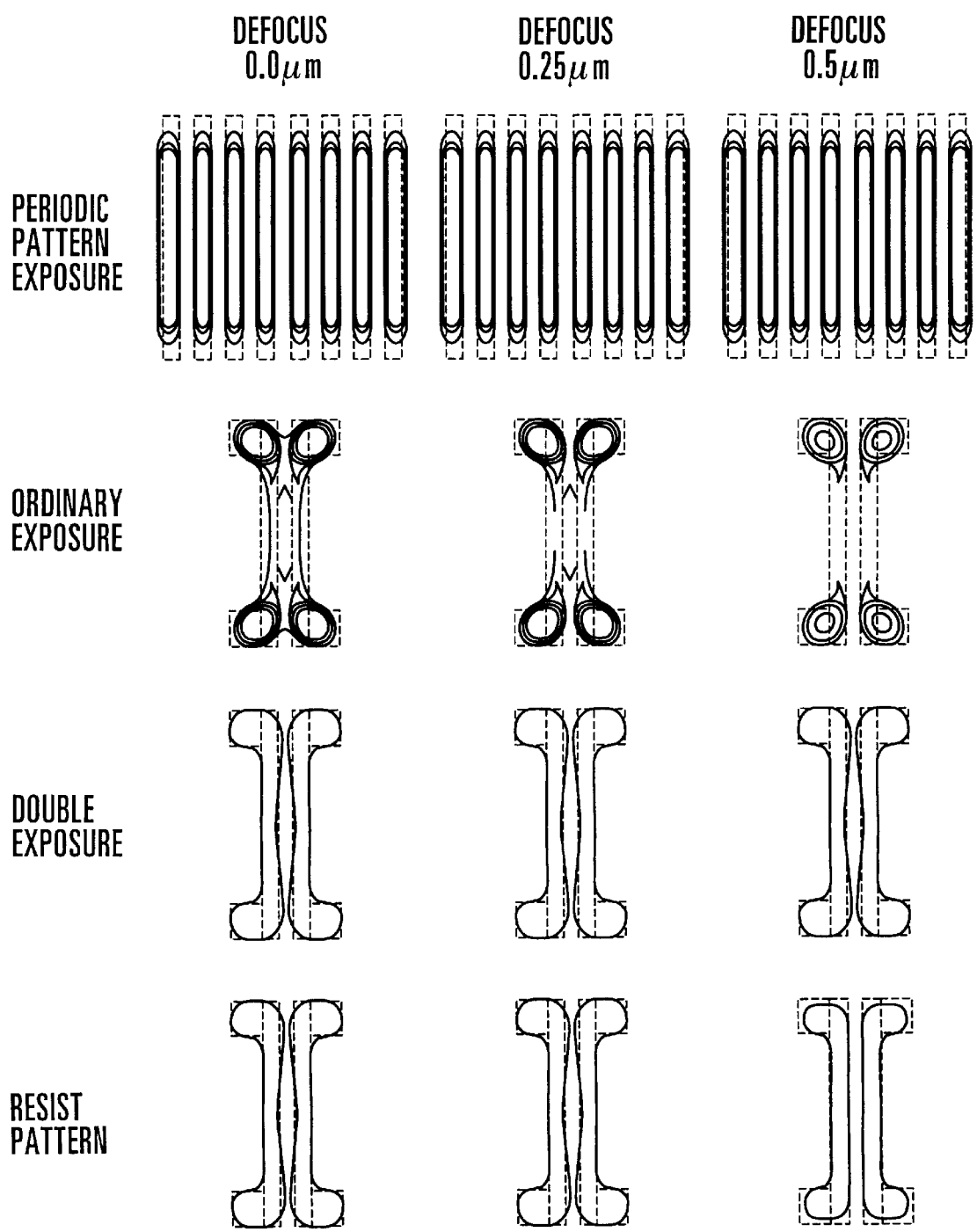
FIG. 13 shows the processes of forming patterns.

FIGS. 12 and 13 are diagrams for explaining pattern forming processes to be carried out with a projection exposure apparatus, i.e., a stepper, arranged to use as a light source a KrF excimer laser which emits a laser beam of wavelength λ of 248 nm. As shown in FIG. 12, an ordinary exposure is made with a gate pattern having a minimum line width of 0.12 μm and, after that, a periodic pattern exposure is made, in a superposing manner, by using a Levenson-type phase shifting mask in such a way as to have the periodic pattern superposed on the minimum line width parts of the gate pattern. The exposure conditions of the pattern forming processes are as follows.

The numerical aperture NA of the projection lens is 0.6. The illumination system is set to a normal illumination having the value of σ at 0.3 for an exposure with a Levenson mask and is set to a ring zone illumination having the value of σ at 0.8 on the outside of a ring and 0.6 on the inside of the ring for an exposure with an ordinary mask. Further, the exposure amount of an exposure with an ordinary mask is set to be twice as much as that of a periodic pattern exposure.

In FIG. 13, which is divided into four steps, the uppermost step part shows an exposure amount distribution obtained on the wafer in forming a periodic pattern by a periodic pattern exposure. The second step part of FIG. 13 from the uppermost part shows an exposure amount distribution obtained by an ordinary exposure. The third step part of FIG. 13 shows an exposure amount distribution obtained by a double exposure made by combining the periodic pattern exposure with the ordinary exposure. The fourth step part of FIG. 13 shows a pattern formed on the wafer by a resist applied thereto.

Each of these step parts of FIG. 13 is divided into three different defocused amounts including, from the left end, 0 μm, 0.25 μm and 0.5 μm.

As shown in the second step part of FIG. 13, minutely fine gate pattern parts are blurred and are hardly definable by the ordinary exposure alone. However, when minute line pattern parts formed by the periodic pattern exposure shown in the first step part of FIG. 13 are superposed on areas where minutely fine gate pattern parts are blurred, the minute areas are resolved and clearly defined as shown in the third step part of FIG. 13. Then, a desired gate pattern is eventually formed on the resist of the wafer as shown in the fourth step part of FIG. 13.

Figure 19:
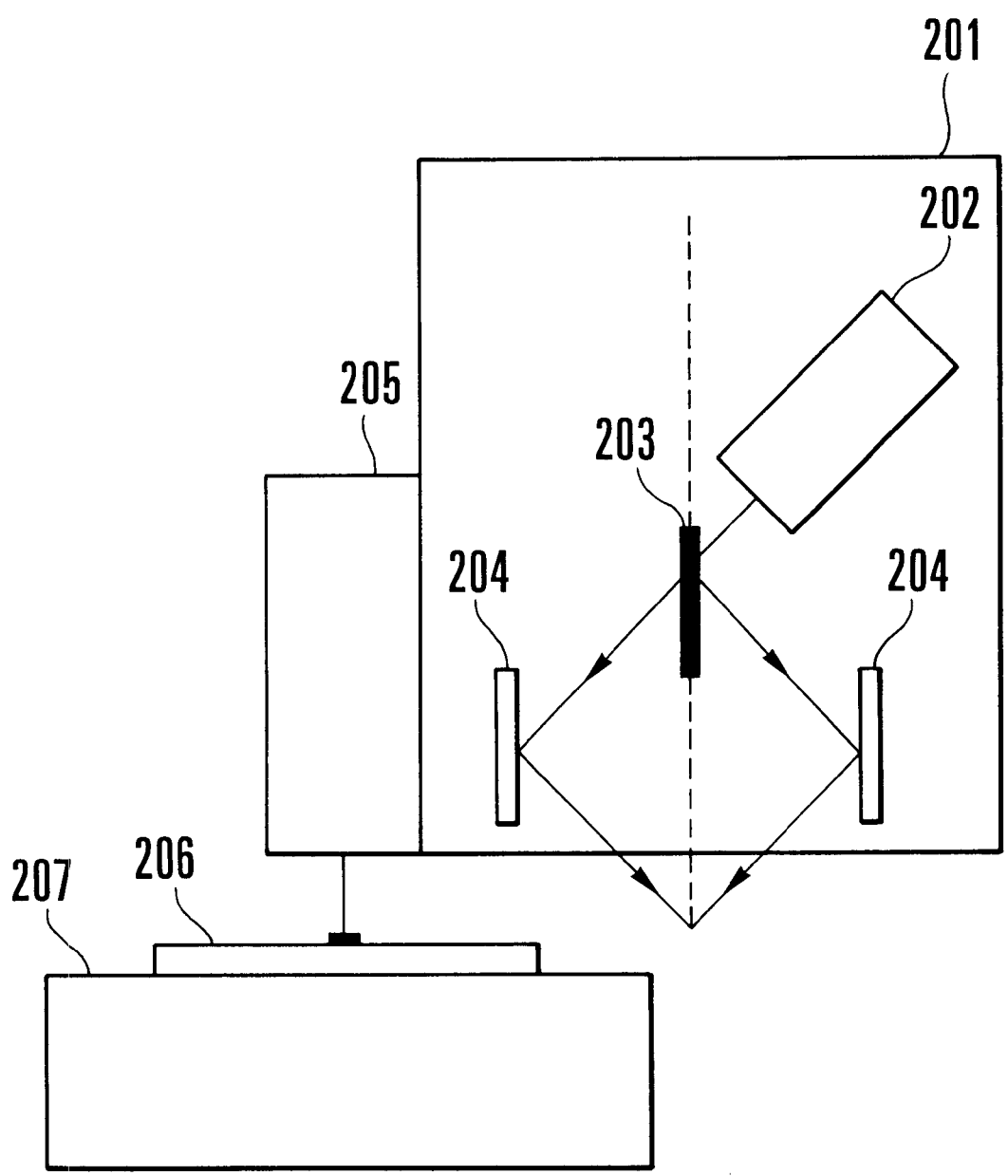
FIG. 19 schematically shows the arrangement of a two-light-flux interference exposure apparatus according to the invention.

FIG. 19 schematically shows by way of example a two-light-flux interference exposure apparatus arranged to make a periodic pattern exposure. Referring to FIG. 19, a two-light-flux interference exposure optical system 201 is arranged basically in the same manner as the optical system shown in FIG. 14. The illustration of FIG. 19 includes a KrF or ArF excimer laser 202, a half mirror 203, flat mirrors 204, and an off-axis type position adjusting optical system 205. The position adjusting optical system 205 is arranged to permit detection of a positional relation to the optical system 201, either as a fixed or base line amount as desired, by observing and detecting the position of a mark provided on a wafer 206 for adjusting the two-light-flux interference position on the wafer 206. The wafer 206 is a photosensitive substrate. An XYZ stage 207 is arranged to be movable on a plane perpendicular to an optical axis of the optical system 201 and also in the direction of the optical axis. The position of the XYZ stage 207 can be accurately controlled by means of a laser interferometer or the like. The arrangement and function of the position adjusting optical system 205 and those of the XYZ stage 207 are well known, and, therefore, the details of them are omitted from description here.

Figure 20:
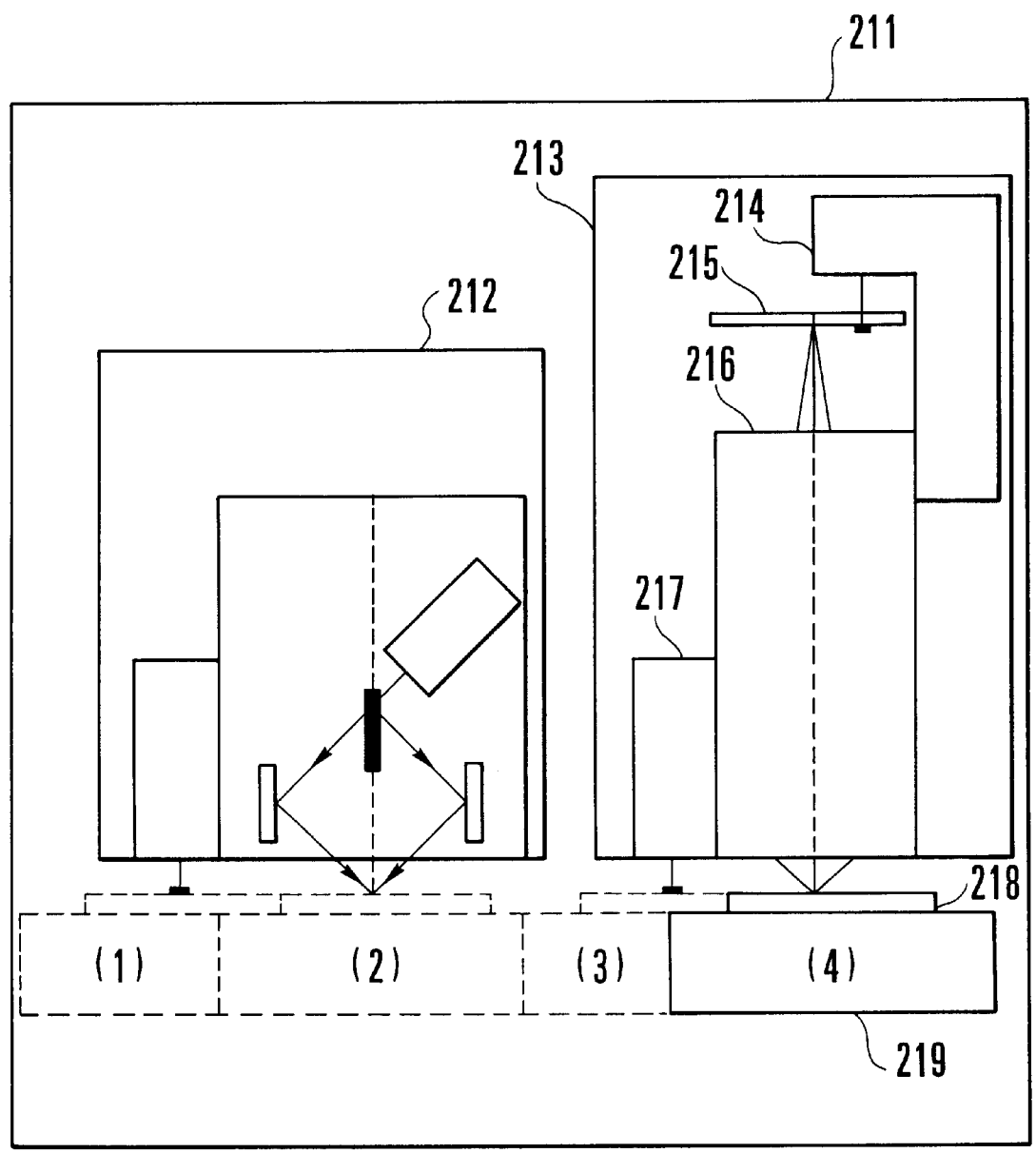
FIG. 20 schematically shows by way of example the arrangement of a high-resolution exposure apparatus according to the invention.

FIG. 20 schematically shows the arrangement of a high-resolution exposure apparatus 211 which is composed of a two-light-flux interference exposure apparatus 212 for making a periodic pattern exposure and an ordinary projection exposure apparatus 213 for an ordinary projection exposure.

Referring to FIG. 20, the two-light-flux interference exposure apparatus 212 is provided with the optical systems 201 and 205 shown in FIG. 19. The ordinary projection exposure apparatus 213 is provided with an illumination optical system (not shown), a reticle positioning optical system 214, a wafer positioning optical system (off-axis positioning optical system) 217, and a projection optical system 216 arranged to project a circuit pattern of a mask 215 on a wafer 218 in a demagnified state.

The reticle positioning optical system 214 is arranged to permit detection of the position of the mask 215 by observing a position adjustment mark provided on the mask 215. The wafer positioning optical system 217 is arranged to permit detection of the position of the wafer 218 by observing a mark provided on the wafer 218 for use in common for a projection exposure and also for a two-light-flux interference exposure. The arrangement and functions of the optical systems 214, 216 and 217 are well known, and therefore, the details of them are omitted from description given here.

In FIG. 20, reference numeral 219 denotes an XYZ stage which is arranged to be used in common for the two-light-flux interference exposure apparatus 212 and the projection exposure apparatus 213. The XYZ stage 219 is movable on a plane perpendicular to each of the optical axes of the apparatuses 212 and 213 and also in the direction of the optical axes. The positions of the XYZ stage 219 in X and Y directions are accurately controlled by means of a laser interferometer or the like.

The XYZ stage 219 which holds and carries the wafer 218 is sent to a position (1) as shown in FIG. 20 to have its position accurately measured there. Then, a two-light-flux interference exposure is made on the wafer 218 by sending the XYZ stage 219, according to the result of the measurement, to the exposure position of the two-light-flux interference exposure apparatus 212 indicated as a position (2) in FIG. 20. After that, the XYZ stage 219 is sent to another position (3) and its position obtained there is accurately measured. Then, the XYZ stage 219 is sent from the position (3) to a position (4) which is the exposure position of the ordinary projection exposure apparatus 213. A projection exposure is made on the wafer 218 at the position (4).

In the ordinary projection exposure apparatus 213, the off-axis positioning optical system 217 may be replaced with a TTL-type positioning optical system arranged to permit detection of the position of the wafer 218 by observing the positioning mark on the wafer 218 through the projection optical system 216. A TTR-type positioning system (not shown) which can be used also in place of the off-axis positioning optical system 217 is arranged to permit detection of the position of the wafer 218 by observing the positioning mark on the wafer 218 through the projection optical system 216 and the mask (reticle) 215.

FIG. 21 schematically shows a stepper-type high-resolution exposure apparatus which makes both a periodic pattern exposure and an ordinary projection exposure. The exposure apparatus is arranged to carry out a double exposure action on each of many shot areas of a wafer in a step-and-repeat manner or in a step-and-scan manner.

In FIG. 21, reference numeral 221 denotes a KrF excimer laser (wavelength of about 248 nm), an ArF excimer laser (wavelength of about 193 nm) or an F2 excimer laser (wavelength of about 157 nm). The illustration of FIG. 21 includes an illumination optical system 222, a reticle (mask) 223, a reticle stage 224, and a projection optical system 227 arranged to project a circuit pattern of the reticle 223 onto a wafer 228 in a demagnifying manner. A reticle changer 226 is arranged to supply the reticle stage 224 selectively with an ordinary reticle, a phase shifting reticle of the Levenson type mention above, an edge-shifter-type reticle or a periodic pattern reticle having no phase shifter. The projection optical system 227 can be arranged to be composed of only a refracting system, to be composed of a refracting system and a reflecting system or to be composed of only a reflecting system.

An XYZ stage 229 is arranged to be used in common for a periodic pattern exposure to be made by the two-light-flux interference method and also for an ordinary projection exposure. The XYZ stage 229 is movable in X and Y directions perpendicular to an optical axis of the projection optical system 227 and also in the direction of the optical axis. The positions of the XYZ stage 229 in the X and Y directions are accurately controlled by means of a laser interferometer or the like. The position of the surface of the wafer 228 in the direction of the optical axis, i.e., the height of the wafer surface is measured by a known surface position measuring system (not shown).

The apparatus shown in FIG. 21 is provided further with a reticle positioning optical system (not shown), a wafer positioning optical system, which corresponds to the off-axis positioning optical system, the TTL positioning optical system or the TTR positioning optical system mentioned above with reference to FIG. 20.

The illumination optical system 222 of the apparatus shown in FIG. 21 is arranged to permit switch-over among a partly coherent illumination of a large σ value, a coherent illumination and a partly coherent illumination of a small σ value. In the case of the coherent illumination, either a parallel illumination (1a) or an oblique incidence illumination (1b) shown within a block 230 is applied to one of various reticles mentioned in the foregoing, including the phase shifting reticle of the Levenson type, the edge-shifter-type reticle or the periodic pattern reticle having no phase shifter. In the case of the partly coherent illumination, a normal illumination (2) shown within the block 230 is applied to a desired reticle. Switching the partly coherent illumination over to the coherent illumination can be made by replacing an aperture stop set immediately after a fly's eye lens of the illumination optical system 222 with a stop which is adapted for the coherent illumination and has an aperture diameter sufficiently smaller than the aperture stop used for the partly coherent illumination.

Next, the features of the multiple exposure method according to the invention are described. FIGS. 22(A) and 22(B) are diagrams for explaining the multiple exposure method according to the first embodiment of the invention.

Referring to FIGS. 22(A) and 22(B), in the multiple exposure method, which includes the periodic pattern exposure using the exposure apparatus (stepper), the ordinary exposure is set to a double, triple or more multiple exposure as follows. In the ordinary exposure, a first exposure process is performed with the surface of the wafer 228 set at a position deviating (defocused) in one direction from the best focus position BF, as shown in FIG. 22(A), and a second exposure process is performed with the surface of the wafer 228 set at a position deviating or defocused from the best focus position BF in the direction opposite to the direction of the first exposure process, as shown in FIG. 22(B).

Now, assuming that the defocus width is denoted by d and the direction going away from the best focus position BF with respect to the projection optical system 227 is denoted by + defocusing, the first exposure process is performed by an exposure with +d defocusing and the second exposure process is performed by an exposure with −d defocusing.

The defocusing directions are not limited to the directions of the first and second exposure processes. Further, a projection exposure may be performed by making an additional exposure with the wafer surface 228 set at the best focus position BF.

Further, the exposure may be made while shifting the wafer 228 within a defocus range in the direction of the optical axis either continuously or by repeating the exposure three times or more than three times.

The width of defocus allowable for the ordinary exposure is within the depth of focus obtainable by the periodic pattern exposure. If the wafer 228 is to be exposed n times, i.e., at an n number of different positions (heights), the defocus width, i.e., a distance between adjacent positions (heights), is set to a value obtained by dividing the depth of focus of the periodic pattern exposure by a value (n−1).

According to the first embodiment, the periodic pattern exposure may be made either before or after the ordinary exposure.

The periodic pattern exposure does not have to be made in a multiple manner by varying the position of the surface of the wafer 228 in the direction of the optical axis, because the depth of focus is deep. In cases where the depth of focus is extremely decreased by the conditions of illumination and where the periodic pattern has an interval distance of an L/S pattern wider than its line width or where the periodic pattern exposure is to be made with a two-dimensional grating pattern, however, the periodic pattern exposure may be carried out also in a multiple manner by shifting the surface position of the wafer 228 to a plurality of positions in the direction of the optical axis.

Figure 23:
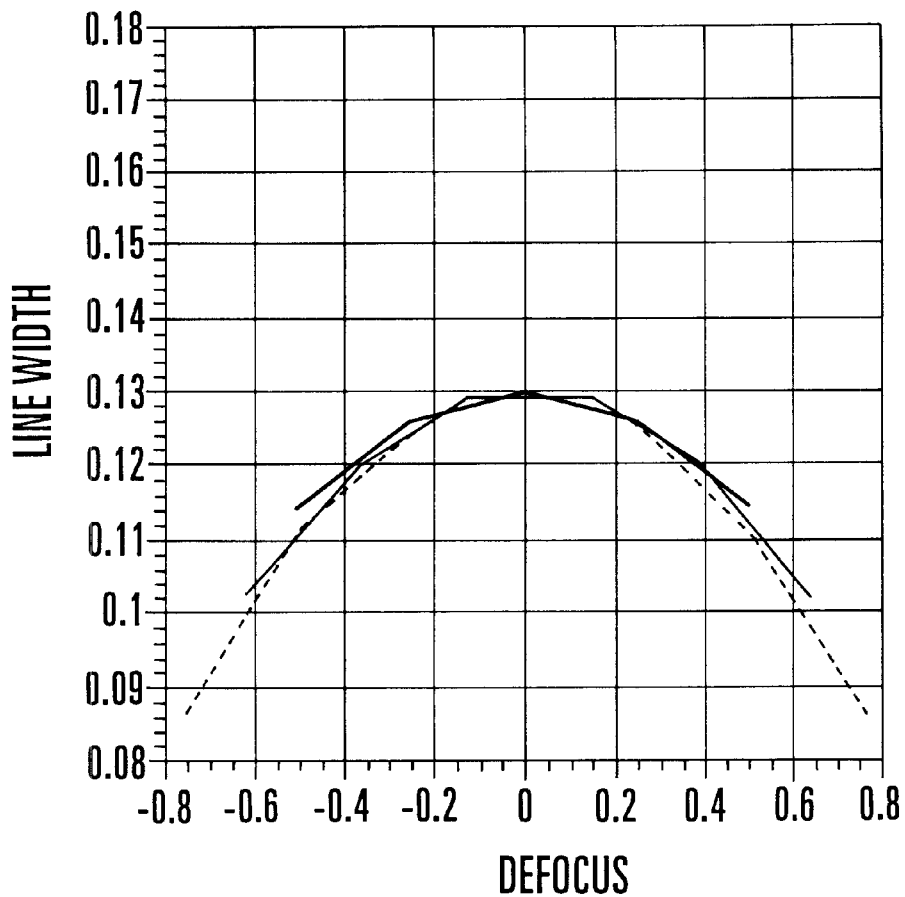
FIG. 23 shows the relationship between the amount of defocus and the variation of line width in the case of a negative resist.

FIG. 23 shows in a graph the results of tests conducted to examine line width errors caused by focus errors (defocus) of the above-stated multiple exposure on a negative resist. In the tests, the direction of having the wafer surface moving further away from the projection optical system 227 was considered to be the positive (+) direction of defocus. The exposure light wavelength was 248 nm (KrF excimer laser beam). The numerical aperture NA on the image side of the projection optical system 227 was 0.60. A pattern image obtained on the surface of the wafer 228 was formed by two lines (line-and-space pattern) measuring 0.13 μm in line width.

The graph of FIG. 23 shows a case where a double exposure was made to include only one ordinary exposure and the periodic pattern exposure, another case where a triple exposure was made by carrying out the ordinary exposure as a double exposure at a defocus width of 0.25 μm and the periodic pattern exposure, and a further case where a triple exposure was made by carrying out the ordinary exposure as a double exposure at a defocus width of 0.5 μm and the periodic pattern exposure.

According to the results of tests, the triple exposure which is composed of the defocused double exposure of the ordinary exposure and the periodic pattern exposure has smaller variations in line width than the double exposure which is composed of the ordinary exposure and the periodic pattern exposure.

Figure 24:
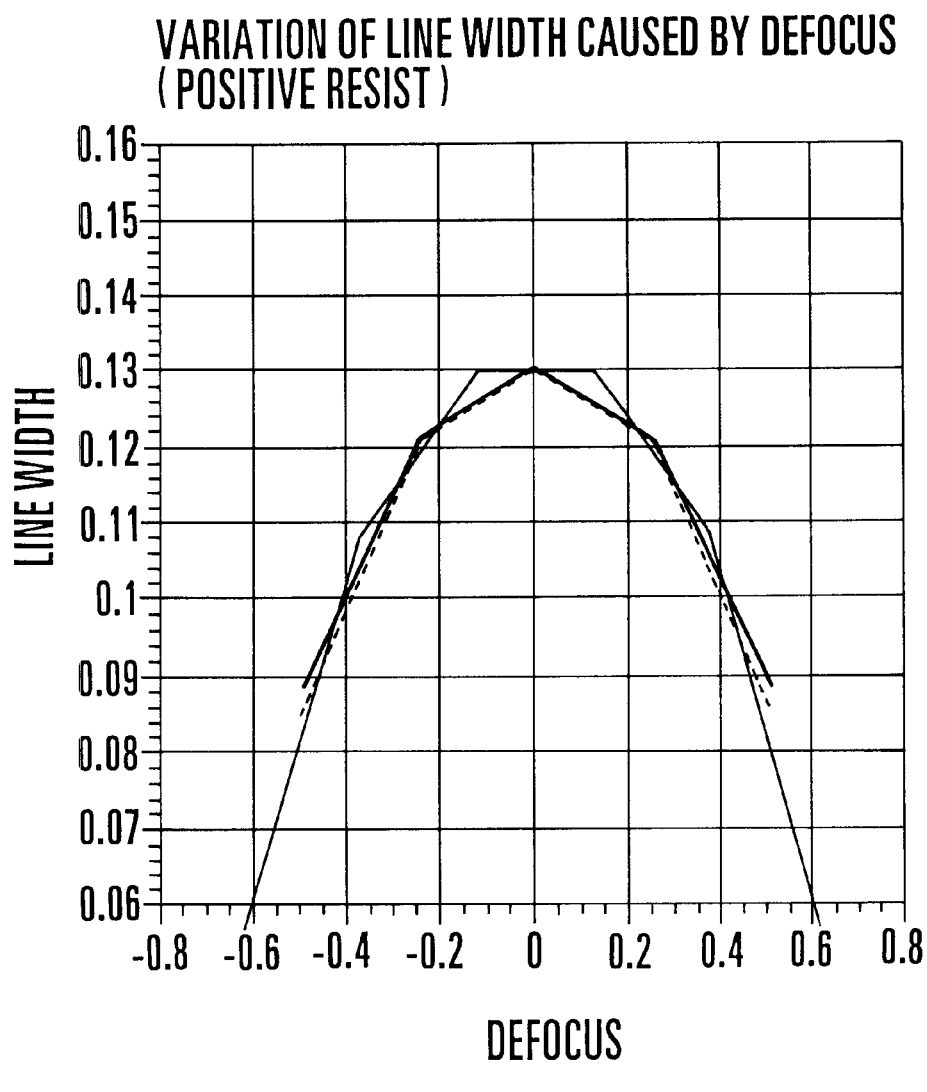
FIG. 24 shows the relationship between the amount of defocus and the variation of line width in the case of a positive resist.
Figure 25:
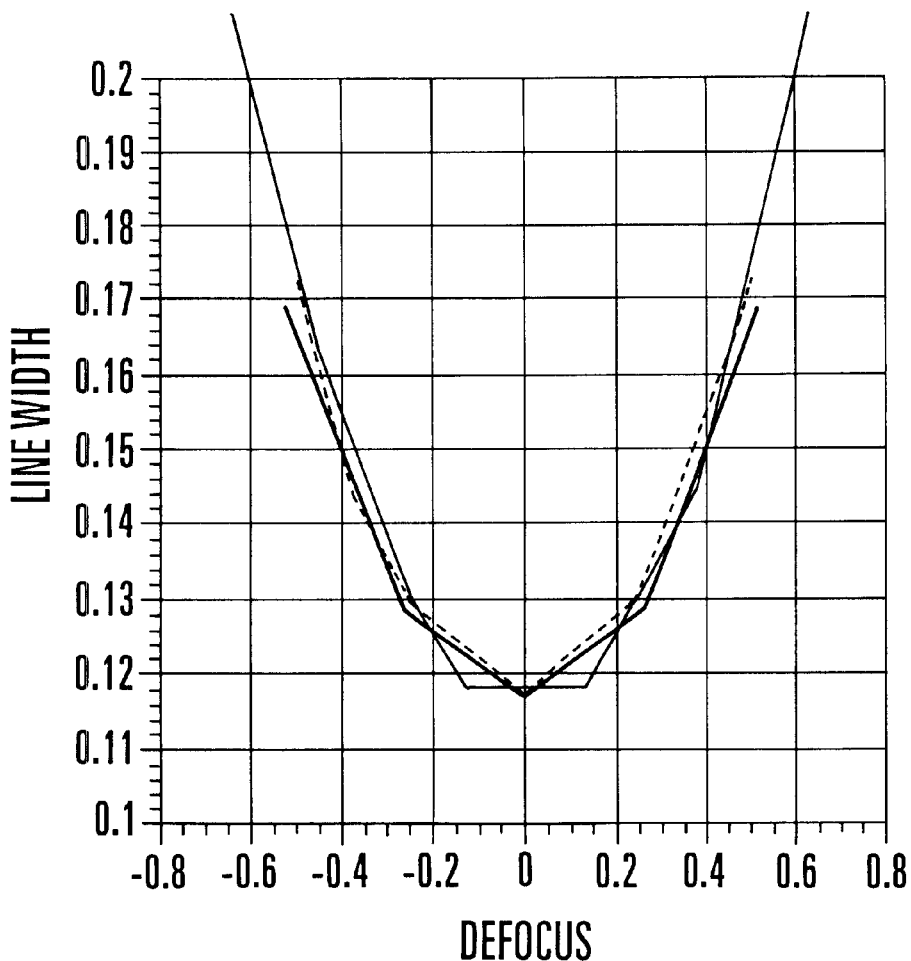
FIG. 25 shows the relationship between the amount of defocus and the variation of line width in the case of a positive resist.

Similar tests were conducted on a positive resist for line width errors caused by focus errors. FIG. 24 shows the results of the tests on the positive resist. FIG. 25 shows results of tests made for variations in spacing between the two lines.

As shown in FIGS. 24 and 25, a triple exposure composed of a defocused double exposure of the ordinary exposure and the periodic pattern exposure has a less change of line width caused by defocusing than in the case of a double exposure composed of the ordinary exposure and the periodic pattern exposure, as in the case of FIG. 23.

In conducting these tests, the projection optical system 227 which had its aberrations thoroughly corrected was used. However, the defocusing comes to cause the line width to asymmetrically vary when a spherical aberration of the optical system becomes larger than a certain amount.

Even though the line width reproducibility is thus caused to deteriorate by the aberration, the line width variations due to defocusing is lessened by averaging and, as a result, the depth of line width increases.

In accordance with the multiple exposure method as described above, the ordinary exposure is made by shifting, or defocusing, the position of the surface of the wafer from its best focus position in one direction. After that, the ordinary exposure is made by shifting the wafer surface position in the opposite direction. With the ordinary exposure thus made twice or more than twice in combination with the periodic pattern exposure, the line width reproducibility of a composite image thus obtained is greatly improved to give a practically sufficient depth of focus.

Further, even if the line width reproducibility is deteriorated by the aberration, the deterioration is lessened by averaging the defocus line width variations to eventually increase the depth of line width.

In order to have the wafer surface at an in-focus position or to defocus it at a plurality of positions by varying a positional relation between the image forming plane of the projection optical system (the best focus position) and the surface of the wafer with respect to the optical axis of the projection optical system, the wafer is moved in the direction of the optical axis according to the method described above. However, in accordance with the invention, this purpose can be attained not only by the method described but also by using known methods such as the method of using a double-focus lens or a pupil filter or the method of varying the focal length of the projection optical system, the position of the reticle, the position of the projection optical system or the wavelength of exposure light.

Next, a multiple exposure method according to a second embodiment of the invention is described. FIGS. 26(A), 26(B) and 26(C) and FIG. 27 schematically show the essential parts of the multiple exposure method according to the second embodiment. In the second embodiment, the multiple exposure method is applied to a step-and-scan type projection exposure apparatus.

In the step-and-scan type projection exposure apparatus, at the time of the ordinary exposure, a projection exposure is made while scanning a wafer 228 in a state of slanting a predetermined slanting angle θ in the scanning direction with respect to a best focus position BF.

After the projection exposure, a periodic pattern exposure is superposed on the projection exposure prior to a developing process. However, this sequence of exposures may be conversely arranged.

Figure 26C:
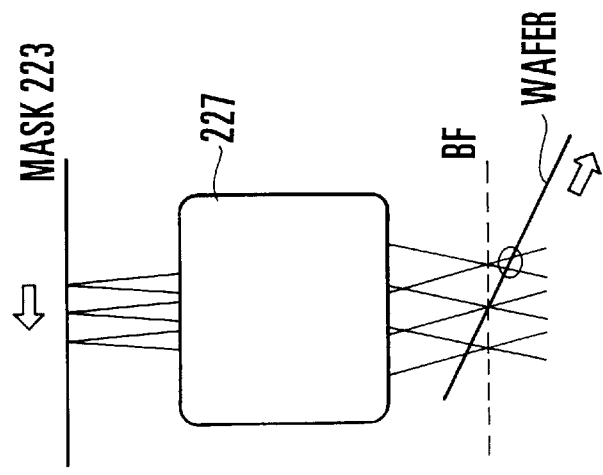
FIGS. 26(A), 26(B) and 26(C) schematically show essential parts of an exposure method according to a second embodiment of the invention.
Figure 26B:
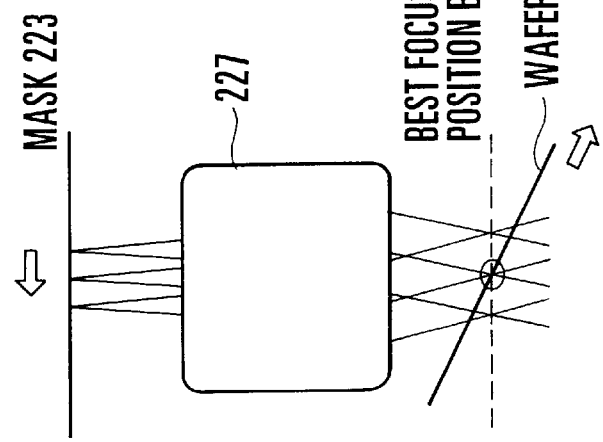
Figure 26A:
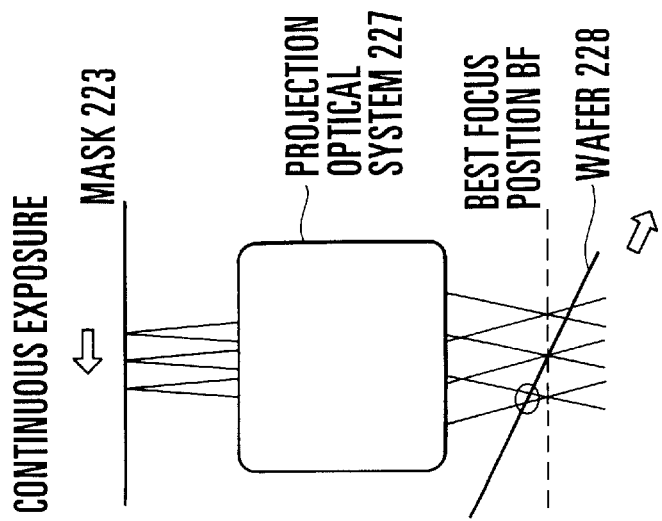

FIGS. 26(A), 26(B) and 26(C) show how a scanning exposure operation proceeds from left to right in the order of FIGS. 26(A) to 26(C). The exposure operation is carried on while the wafer 228 and a mask 223 are being scanned in opposite directions by a scanning exposure system. In this case, the mask 223 is scanned at a speed which is m times as fast as the scanning speed for the wafer 228 with the projection magnification assumed to be m.

Referring to FIGS. 26(A) to 26(C), as indicated by a point marked ○ on the wafer 228, the wafer 228 is exposed, in the state shown FIG. 26(A), at a position closer to the projection optical system 227 than the best focus position BF, i.e., exposed in a state being defocused to an extent of −d. In the state of FIG. 26(B), the wafer 228 is exposed in the best focus position BF. In the state of FIG. 26(C), the wafer 228 is exposed at a position farther away from the projection optical system 227 than the best focus position BF, i.e., exposed in a state being defocused to an extent of +d.

In this instance, the wafer 228 is continuously exposed over the whole range of a defocus width 2d from the defocus position −d to the defocus position +d.

The defocus width is determined by the slanting angle θ. Therefore, the defocus width can be increased, if so desired, by increasing the slanting angle θ.

The relation of the slanting angle θ to the defocus width is next described below with reference to FIG. 27.

Figure 27:
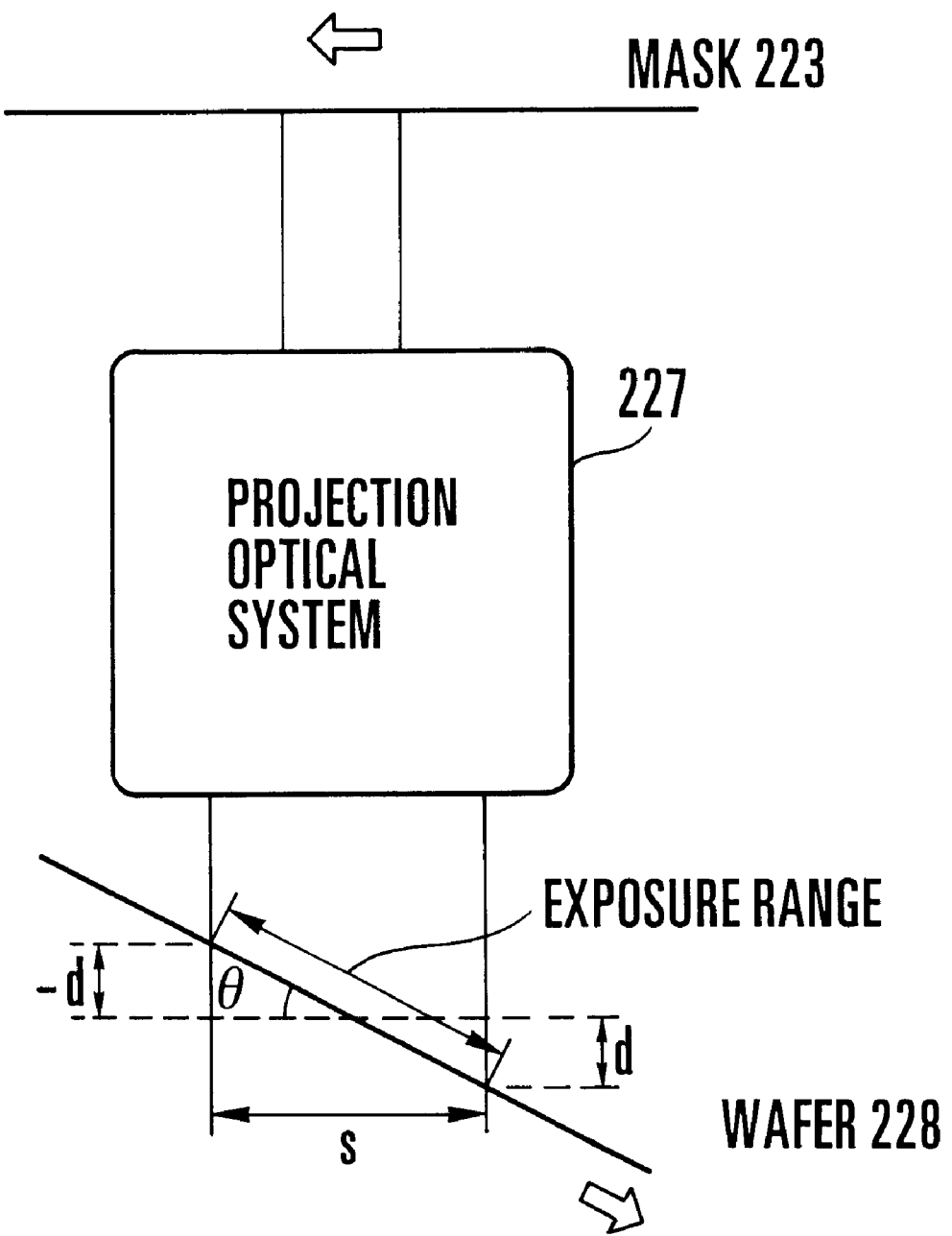
FIG. 27 schematically shows essential parts of the exposure method according to the second embodiment.

Referring to FIG. 27, with the exposure range of the whole scanning exposure assumed to be "s", the relation between the defocus width 2d and the slanting angle θ can be expressed as follows:

$$2d = s \times \tan \theta$$

The defocus width 2d normally measures from 2 μm to 0.1 μm or thereabout. The exposure range s ranges from several mm to several scores of mm. Therefore, if the defocus width 2d and the exposure range s are assumed to be 2d=1 μm and s–10 mm, the slanting angle θ becomes θ=0.0057 degree.

This value indicates an extremely small angle.

Further, with the wafer 228 slanted, the exposure range s on the wafer 228 is expanded and increased from an actual range. However, since the slanting angle θ is extremely small, the expansion of the exposure range s is considered to bring about no adverse effect. However, in a case where the expanded exposure range is considered to present a problem, the problem can be solved by increasing the scanning speed for the mask by 1/cos θ times.

Figure 28B:
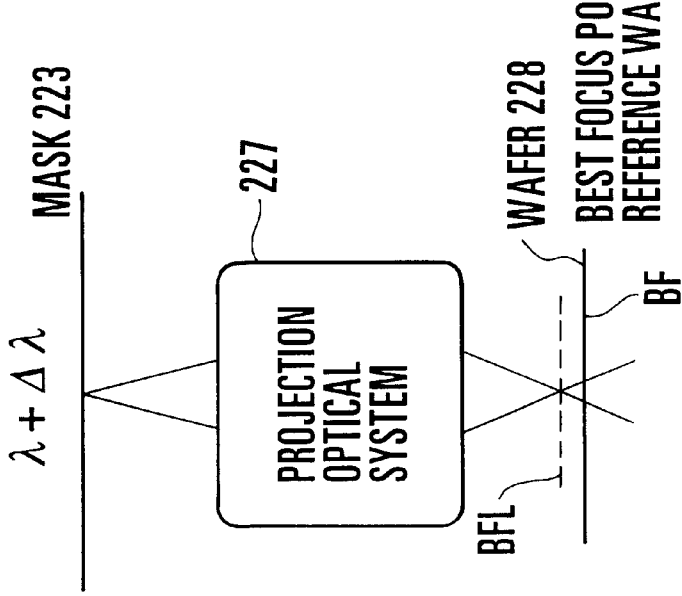
FIGS. 28(A) and 28(B) schematically show essential parts of an exposure method according to a third embodiment of the invention.
Figure 28A:
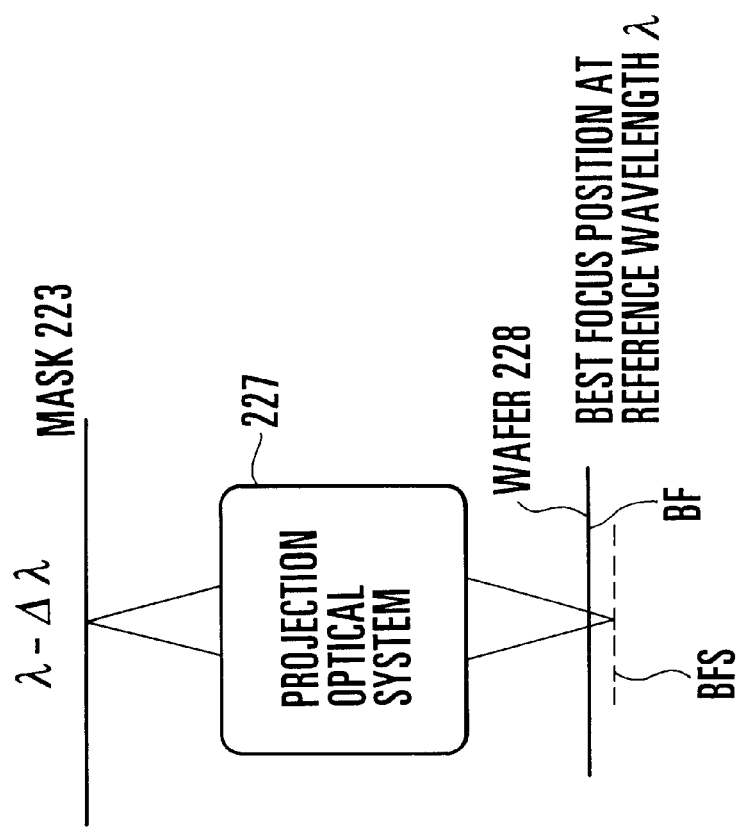

FIGS. 28(A) and 28(B) schematically show a multiple exposure method according to a third embodiment of the invention. In the case of the third embodiment, the ordinary exposure is composed of first and second exposures, which are carried out as follows. The first exposure is made with light of a wavelength which is slightly shorter than a reference wavelength. After that, the second exposure is made with light of a wavelength which is slightly longer than the reference wavelength and is superposed on the first exposure. Thus, the focus position is varied by the chromatic aberration of the projection optical system 227 obtained by making the ordinary exposure in the above manner.

After the ordinary exposure, a periodic pattern exposure is made with a periodic pattern which has a high contrast, prior to a developing process.

The sequence of the first and second exposures of the ordinary exposure can be conversely arranged. The exposure wavelengths and the sequence of these exposures can be set as desired. In making the ordinary exposure by varying the exposure wavelength, the exposure may be carried on either by continuously varying the wavelength width or by repeating the exposure twice or more.

In a case where the exposure is to be repeated n times, the wavelength width, in varying the wavelength, is preferably arranged to be not exceeding a value obtained by dividing the depth of focus of the periodic pattern exposure by (n–1).

The arrangement of the third embodiment is next described with reference to FIGS. 28(A) and 28(B). As shown in FIGS. 28(A) and 28(B), the wafer 228 is set in the best focus position BF for the reference wavelength λ. When an exposure is made with light of a wavelength λS which is slightly shorter than the reference wavelength λ, the chromatic aberration of the projection optical system 227 causes a best focus position BFS for the shorter exposure wavelength λS to be obtained at a position deviating from the best focus position BF for the reference wavelength λ.

Therefore, the wafer 228 is placed at a defocus position which deviates from a best focus position for the exposure wavelength.

When another exposure is made with light of a wavelength λL which is slightly longer than the reference wavelength λ, the chromatic aberration of the projection optical system 227 causes a best focus position BFL for the longer exposure wavelength λL to be obtained at a position deviating from the best focus position BF of the reference wavelength on one side thereof which is opposite to the position of the shorter wavelength.

The wafer 228 is thus placed at a defocus position which deviates from the best focus position for the exposure wavelength on the opposite side.

The sequence of the exposure on the shorter wavelength side and the exposure on the longer wavelength side may be conversely arranged. The exposures on the shorter and longer wavelength sides may be either repeated many times or made continuously.

The wavelengths shorter and longer than the reference wavelength are decided according to the refractive index and the degree of its dispersion of the glass material used for the projection optical system 227. A larger difference between the wavelengths on the shorter and longer wavelength sides results in a larger defocus width. However, if the difference between the wavelengths on the shorter and longer wavelength sides is set to be within such a correctable range of chromatic aberration that has no influence on other than the defocus shift, the adverse effect of the aberration can be made to be negligible.

The advantages of the multiple exposure method according to the first, second and third embodiments are next described. FIGS. 29 and 30 shows these advantages.

Exposure tests were conducted on the following conditions. The reference wavelength λ=0.3655 μm (i-line). NA=0.60. Contact hole width=0.3 μm. The constant $k_1$=(0.3/0.3655)×0.6=0.49, derived from "$k_1$=0.3/(λ/NA)".

Illumination conditions were as follows. The illumination was arranged to have σ=0.8 for the ordinary exposure, and σ=0.2 for the periodic pattern exposure using the Levenson-type phase shifting mask. The Levenson-type phase shifting mask was provided with a phase shifter of a checkered grating shape on a chromium grating.

The wafer was exposed in a superposing manner at two exposure wavelengths of λ±Δλ. With the wafer set in the best focus position for the reference wavelength 0.3655 λm, the ordinary exposure was made at exposure wavelengths of 0.3655 μm±2 nm(Δλ=2 nm), and the periodic pattern exposure was made only once at the reference wavelength.

The exposure operation also may be made as follows. With the reference wavelength λ fixed at 0.3655 μm, the ordinary exposure is first made at a position defocused 0.5 μm from the best focus position and, then made once more at a position defocused –0.5 μm.

With the best focus position assumed to be "d", the same advantageous effect can be attained either by setting the defocus amount Δd at 0.5 μm and by making a double exposure or a continuous exposure at positions of d±Δd.

FIG. 29 shows results of the pattern exposures obtained at isolated holes. The results shown in FIG. 29 include, from the uppermost part of FIG. 29, the result of one exposure made at an exposure wavelength of λ–Δλ, the result of one exposure made at λ+Δλ, the result of superposed exposures at these exposure wavelengths, and the result of superposed exposures obtained by superposing the periodic pattern exposure further on these exposures. In FIG. 29, "def=0.0" corresponds to the best focus position for the reference wavelength λ. The best focus position shifts as the exposure wavelength varies.

A depth of 0.75 μm ($k_2$=0.75/(0.3655/0.62)=0.74) was obtained by the one exposure. A depth of 1.0 μm ($k_2$=0.98) was obtained by the double exposure composed of two defocus-shifted ordinary exposures. However, image defining in this case was difficult as the contrast lowers. By the triple exposure including the periodic pattern exposure, a depth of 1.5 μm ($k_2$=1.48) was obtained.

In the case of the double exposure composed of two defocus-shifted ordinary exposures, as a result of superposed ordinary exposures at the two exposure wavelengths, the depth increased although the image thus obtained blurred.

With the periodic pattern exposure superposed on the double exposure, the image contrast increased, thus becoming twice as much as the contrast obtained by the one ordinary exposure.

FIG. 30 shows the results of exposures obtained at a row of three contact holes which are the same in hole width and space. The results shown in FIG. 30 include, from the uppermost part of FIG. 29, the result of one exposure made at the wavelength of $\lambda-\Delta\lambda$, the result of superposed exposures at the wavelength of $\lambda\pm\Delta\lambda$, and the result of superposed exposures obtained by superposing the periodic pattern exposure on the double exposure.

In this instance, as a result of the double exposure at the exposure wavelengths of the first and second ordinary exposures, the depth was increased while the contrast became lower than the contrast obtained by the one ordinary exposure.

With the periodic pattern exposure superposed on the double exposure, the image contrast increased to give a depth of 1.5 $\mu$m ($k_2$=1.48), which was about twice as much as a depth obtained by the one ordinary exposure.

In the above examples, an exposure is made with exposure light of i-line. However, the invention is not limited to the i-line exposure. Although the wavelength width becomes narrow by the use of a KrF or ArF excimer laser, the advantages of the invention can be likewise attained by using such a laser within the narrower range of wavelengths by carrying out the superposed exposures at the wavelengths of $\lambda\pm\Delta\lambda$ with the width $\Delta\lambda$ set to one half or less of the ordinary width.

In the example described above, the superposed exposures are carried out at the two wavelengths $\lambda-\Delta\lambda$ and $\lambda\pm\Delta\lambda$ obtained by shifting the exposure wavelength from the reference wavelength $\lambda$ with the wafer set at the best focus position for the reference wavelength. However, the same advantageous effect can be attained also by using the reference wavelength as the exposure wavelength and carrying out a superposed exposure, or a continuous exposure, with the position of the wafer vertically shifted ±0.5 $\mu$m from the best focus position, as in the first and second embodiments.

The results of tests conducted as shown in FIG. 30 show that the exposures of the row of contact holes give the same advantageous effect of increasing the depth as the exposures of the isolated holes shown in FIG. 29.

Further, FIGS. 29 and 30 show the results of exposures made at the same exposure light intensity. The comparison of these test exposures shows that, while the contrast and the size obtained by the superposed exposure of ordinary exposures at the wavelengths $\lambda\pm\Delta\lambda$ vary according to whether the superposed exposure is made on the isolated holes or on aggregative hole rows, such difference in contrast and size between the isolated holes and the aggregative hole rows almost completely disappears in the case of the triple exposure including the periodic pattern exposure.

It is, therefore, apparent that the triple exposure including the periodic pattern exposure effectively increases the depth of focus, uniformalizes the sizes of the isolated holes and the aggregative hole rows, and thus gives images with excellent shape reproducibility.

The advantage of the invention in respect to a wiring pattern composed of an L/S pattern, i.e., lines and spaces, to be formed by a pattern exposure is next described below.

Circuit patterns actually in use seldom have such an aggregative pattern that has a line width and a spacing distance arranged equal to each other, i.e., in the ratio of 1:1, even in the case of L/S patterns. Even in the case of the ratio of 1:1, the circuit patterns are generally arranged in the form of two lines. Further, in many cases, the line width and the space are different more than in the ratio of 1:2, so that the circuit patterns can be regarded as isolated patterns in many cases. For example, a pattern as shown in FIG. 31 is generally employed as part of a circuit pattern.

An experiment on exposures was made according to the exposure method for an actual circuit pattern as shown in FIG. 31. The conditions of the experiment were as follows. The reference wavelength $\lambda$=0.3655 $\mu$m (i-line), NA=0.60, and the line width=0.3 $\mu$m ($k_1$=(0.3/0.3655)×0.6=0.49). Four pattern lines were formed to have a line width L respectively. The first and second lines were spaced 5L. The second and third lines were spaced 3L. The third and fourth lines were spaced 1L. An L/S Levenson-type phase shifting mask was used for a periodic pattern. The exposure wavelength of the ordinary exposure was set to "0.3655 $\mu$m±2 nm ($\Delta\lambda$=2 nm)". The periodic pattern exposure was made once at the reference wavelength.

Alternatively, the ordinary exposure was made first by defocusing 0.5 $\mu$m from the best focus position, and then the ordinary exposure was also made by defocusing −0.5 $\mu$m from the best focus position.

In other words, assuming that the defocus position was d and $\Delta$d=0.5 $\mu$m, a double exposure was made at positions of d±$\Delta$d.

Figure 33:
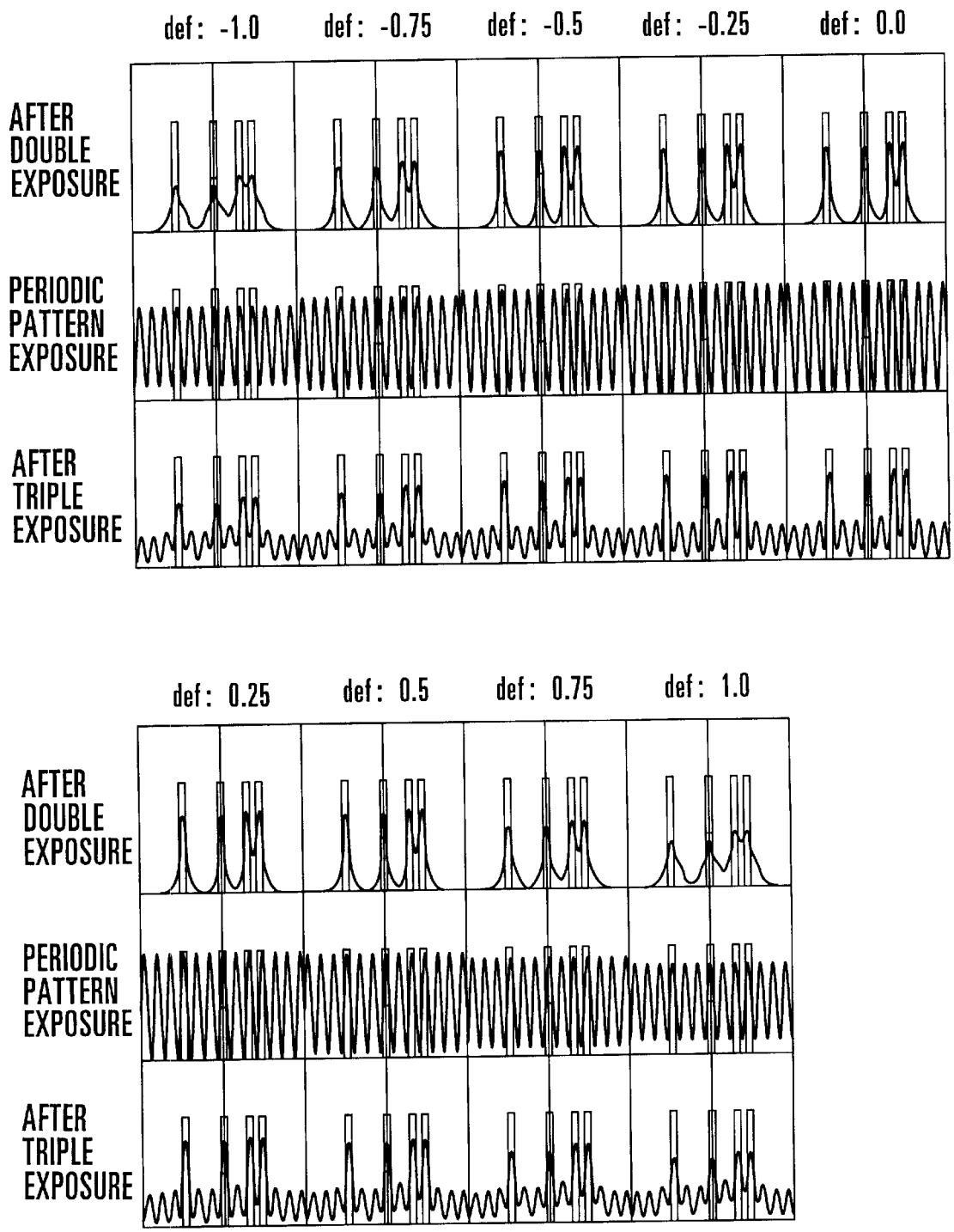
FIG. 33 shows advantageous effects attainable by the exposure method of the invention.

FIGS. 32 and 33 show one-dimensional intensity distributions obtained at a section of the pattern as shown in FIG. 31.

The intensity distributions shown in FIG. 32 include those obtained at a position of defocus d by the ordinary exposure of wavelength $\lambda-\Delta\lambda$ or at a position of defocus d−$\Delta$d by the ordinary exposure of wavelength $\lambda$, those obtained at a position of defocus d by the ordinary exposure of wavelength $\lambda+\Delta\lambda$ or at a position of defocus d+$\Delta$d by the ordinary exposure of wavelength $\lambda$, and those obtained by a double exposure composed of the above two exposures.

In FIG. 32, "def=0.0" corresponds to the best focus position at the reference wavelength $\lambda$.

FIG. 33 shows the intensity distributions obtained by a double exposure composed of the ordinary exposures of wavelength $\lambda\pm\Delta\lambda$ (or d±$\Delta$d), those obtained by the periodic pattern exposure, and those obtained by a triple exposure which is made by superposing the image of the periodic pattern exposure on the image of the double exposure.

In the intensity distributions obtained by the double exposure as shown in FIG. 32, the image is blurred to lower its contrast as compared with the image obtained by the one ordinary exposure. However, the blurred image is resolved to a large depth of focus within a defocus range from −1.0 $\mu$m to 1.0 $\mu$m.

On the other hand, in the case of the intensity distributions obtained by the triple exposure including the periodic exposure pattern, as shown in FIG. 33, as compared with the double exposure at the wavelength $\lambda\pm\Delta\lambda$ (or d±$\Delta$d), the edges of the four lines are steeply and uniformly slanting to give a higher and uniform contrast.

In the result of the double exposure composed of the ordinary exposures, the intensity distributions spread in its skirt part as a minimum value is taken at the center of a space between one pattern line and another pattern line. Therefore, among the four lines, the pattern edge inclination of pattern lines having a wider space between them differs from that of pattern lines having a narrower space between them.

The following describes an example in which the ordinary exposure with the exposure position defocused is made only once without a double exposure composed of ordinary exposures, and, then, a double exposure is made by performing the periodic pattern exposure after the one ordinary exposure.

FIG. 34 shows intensity distributions obtained at a one-dimensional section, including, from the uppermost part of FIG. 34, those obtained by the one ordinary exposure, those obtained by the periodic pattern exposure, those obtained by a double exposure composed of the ordinary exposure and the periodic pattern exposure.

In the case of FIG. 34, since the periodic pattern has a large depth, both the contrast and the depth increase when a double exposure is made by superposing the periodic pattern exposure on the one ordinary exposure.

As is apparent from a comparison of FIGS. 33 and 34, although the contrast is somewhat lower around the best focus position in the case of FIG. 33, the contrast uniformly spreads over a wide range to increase the depth.

The contrast is computed for each of the four lines and the depth of the contrast is defined as the depth obtained at a part where it is the lowest within the defocus range.

Depths of the contrast are compared as follows. According to the results of exposures shown in FIG. 33, the 50% depth of contrast obtained is 1.1 $\mu$m ($k_2$=1.08) by the one ordinary exposure, 0.5 $\mu$m ($k_2$=0.49) by the ordinary defocused double exposure (defocus width 1 $\mu$m, $k_2$=0.98), and 1.6 $\mu$m ($k_2$=1.58) by the triple exposure including the periodic pattern exposure. The 40% depth of contrast is 1.3 $\mu$m ($k_2$=1.28) by the one ordinary exposure, 1.2 $\mu$m ($k_2$=1.18) by the ordinary defocused double exposure, and 2.1 $\mu$m ($k_2$=2.07) by the triple exposure including the periodic pattern exposure.

In the case of FIG. 34, the 50% depth of contrast obtained is 1.1 $\mu$m ($k_2$=1.08) by the one ordinary exposure, and 1.5 $\mu$m ($k_2$=1.48) by the double exposure including the periodic pattern exposure. The 40% depth of contrast is 1.3 $\mu$m ($k_2$=1.28) by the one ordinary exposure, and 1.8 $\mu$m ($k_2$=1.77) by the double exposure including the periodic pattern exposure.

Therefore, the triple exposure composed of the ordinary defocused exposures and the periodic pattern exposure gives a deeper depth of contrast than the double exposure composed of the one ordinary exposure and the periodic pattern exposure.

The triple exposure can be arranged to give still deeper depth by increasing the defocus width of the ordinary defocused exposures. Further, since the contrast resulting from the triple exposure moderately varies in relation to defocus, the change of image shape due to defocus takes place to a less degree, so that a defocus characteristic can be improved by the triple exposure.

The problem that the ordinary exposure gives a shallow depth thus can be solved by the triple exposure, as the triple exposure gives an averaged uniform image against defocusing, although the image may be somewhat more blurred than in the case of the ordinary exposure.

The results of tests or experiments described above indicate advantageous effects on the pattern of contact holes and that of wiring as shown in the above embodiments.

Particularly, in respect of the contact holes, the advantageous effect attained on isolated contact holes is likewise attained also on the row of contact holes having the hole width and space in the ratio of 1:1. In this case, the width of ±0.5 defocus shift for the ordinary exposures is set to 1.0 $\mu$m ($k_2$=0.98).

Since circuit patterns actually in use seldom have such an aggregative pattern that has pattern line width and spacing distance in the ratio of 1:1 even in the case of L/S patterns, as described in the foregoing, the exposure method according to the invention is advantageous also for wiring patterns.

In the case of the first embodiment, the triple exposure is made with an L/S wiring pattern, as shown in FIGS. 23, 24 and 25. In this case, even if the width of defocus shift for the double exposure composed of ordinary exposures is relatively narrow, such as 0.25 $\mu$m ($k_2$=0.36) or 0.5 $\mu$m ($k_2$=0.73), the triple exposure composed of the ordinary defocused double exposure and the periodic pattern exposure gives an advantageous effect of averaging the line width against defocus.

According to the embodiments described, after completion of a multiple defocused exposure, a periodic pattern exposure having a high contrast is superposed on the multiple defocused exposure. Accordingly, a pattern image can be formed to have a high contrast with adequate shape reproducibility.

Generally, a pattern image obtained only by a multiple defocused exposure has a low contrast with insufficient shape reproducibility.

The superposed exposure including an ordinary exposure and a periodic pattern exposure according to the invention forms a circuit pattern to have uniform image shapes of isolated parts and the aggregative parts. Since the image shapes are uniformly obtained without any salient difference between, for example, the middle part and both ends of each row of contact holes, the exposure method excels in shape reproducibility.

With the depth enlarged by superposing ordinary exposures made at differently defocused positions on each other, the enlarged depth can be further increased, in accordance with the invention, by superposing on the superposed ordinary exposures a periodic pattern exposure having a wider depth.

According to the multiple exposure method of the invention, a multiple exposure which includes at least two exposures is carried out, for example, by making a first ordinary exposure at a position defocused from the best focus position and then making a second ordinary exposure at a position defocused in a direction opposite to the defocus direction of the first exposure. The multiple exposure effectively improves the defocus characteristic of a composite pattern image thus obtained. The multiple exposure method thus effectively gives such depth that is deeper than a practical depth.

Further, according to the invention, the same advantageous effect can be attained also by carrying out an exposure at least twice at exposure wavelengths which deviate from a reference wavelength. Further, according to the invention, the exposure wavelength (reference wavelength) is not limited to 248 nm or 365 nm as described in the above embodiments.

The effect of increasing the depth can be attained even if the ordinary exposure pattern is a wiring pattern. The effect is salient particularly for the contact holes of the wiring pattern.

Further, even in a case where the line width reproducibility is deteriorated by some aberration, the depth of line width can be increased as the variations of defocus line width can be lowered by averaging them.

Various devices including semiconductor chips such as an IC and LSI, display elements such as a liquid crystal panel, detection elements such as a magnetic head, and image sensors such as a CCD or the like can be manufactured according to the exposure method and by using the exposure apparatus described in the foregoing.

The invention is not limited to the embodiments described above. Various modifications are possible within the spirit of the invention. Particularly, with respect to the step of the two-light-flux interference exposure and that of the ordinary exposure, the number of times of making the exposure and the number of stepwise-divided amounts of exposure can be changed and adjusted as desired. The range of possible variations of circuit patterns can be increased by such adjustment.

Further the invention is applicable to any other known multiple exposure arrangement that includes a periodic pattern exposure.

What is claimed is:

1. An exposure method for performing a periodic pattern exposure in which an exposure is performed with a periodic pattern and a projection exposure in which an exposure is performed by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, said exposure method being characterized in that the projection exposure is performed while varying a relationship in position in an optical axis direction of a projection optical system between an image forming plane of the projection optical system and an exposure area, and that an interval of a plurality of positions of the exposure area relative to the image forming plane is set to a value not greater than a value obtained by dividing a depth of focus in the periodic pattern exposure by n−1 where n is the number of the plurality of positions.

2. An exposure method for performing a periodic pattern exposure in which an exposure is performed with a periodic pattern and a projection exposure in which an exposure is performed through a projection optical system by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, said exposure method being characterized in that the projection exposure includes a plurality of exposures which are serially performed respectively with a plurality of light beams of wavelengths including a light beam of wavelength shorter than a reference wavelength and a light beam of wavelength longer than the reference wavelength without performing a developing process between the plurality of exposures.

3. An exposure method for performing a periodic pattern exposure in which an exposure is performed with a periodic pattern and a projection exposure in which an exposure is performed through a projection optical system by using a mask having a pattern whose line width is not greater than a resolving power of an exposure apparatus used therefor, the periodic pattern exposure and the projection exposure are being performed on a common exposure area without performing a developing process between the periodic pattern exposure and the projection exposure, said exposure method being characterized in that the projection exposure includes a plurality of exposures which are serially performed respectively with a plurality of light beams of wavelengths including a light beam of wavelength shorter than a reference wavelength and a light beam of wavelength longer than the reference wavelength without performing a developing process between the plurality of exposures, and that a difference between best focus positions obtained by the light beam of shorter wavelength and the light beam of longer wavelength used for the projection optical system is within a depth of focus of the periodic pattern.

4. An exposure method according to claim 3, wherein, where the plurality of exposures are n exposures and a wavelength difference between the longer wavelength and the shorter wavelength is represented by $\lambda d$, the n exposures are performed while varying a wavelength width $\Delta\lambda$ as much as $\Delta\lambda = \lambda d/(n-1)$.

5. An exposure method according to claim 1, wherein a period of the periodic pattern on the image forming plane of the projection optical system is twice or approximately twice as much as a value obtained by reducing a minimum line width of the pattern of the mask on an exposure plane.

6. An exposure method according to claim 2, wherein a period of the periodic pattern on an image forming plane of the projection optical system is twice or approximately twice as much as a value obtained by reducing a minimum line width of the pattern of the mask on an exposure plane.

7. An exposure method according to claim 3, wherein a period of the periodic pattern on an image forming plane of the projection optical system is twice or approximately twice as much as a value obtained by reducing a minimum line width of the pattern of the mask on an exposure plane.

8. An exposure method according to claim 1, wherein the periodic pattern exposure and the projection exposure are performed in such a manner that a peak of light intensity distribution of one pattern portion of the periodic pattern on the image forming plane of the projection optical system coincides or approximately coincides with the center of an image of a pattern portion of minimum line width of the pattern of the mask.

9. An exposure method according to claim 2, wherein the periodic pattern exposure and the projection exposure are performed in such a manner that a peak of light intensity distribution of one pattern portion of the periodic pattern on an image forming plane of the projection optical system coincides or approximately coincides with the center of an image of a pattern portion of minimum line width of the pattern of the mask.

10. An exposure method according to claim 3, wherein the periodic pattern exposure and the projection exposure are performed in such a manner that a peak of light intensity distribution of one pattern portion of the periodic pattern on an image forming plane of the projection optical system coincides or approximately coincides with the center of an image of a pattern portion of minimum line width of the pattern of the mask.

11. An exposure method according to claim 1, wherein the projection exposure is performed by using exposure light having a center wavelength of not greater than 400 nm.

12. An exposure method according to claim 11, wherein the exposure light is supplied by one of a KrF excimer laser, an ArF excimer laser and an F2 excimer laser.

13. An exposure method according to claim 2, wherein the projection exposure is performed by using exposure light having a center wavelength of not greater than 400 nm.

14. An exposure method according to claim 13, wherein the exposure light is supplied by one of a KrF excimer laser, an ArF excimer laser and an F2 excimer laser.

15. An exposure method according to claim 3, wherein the projection exposure is performed by using exposure light having a center wavelength of not greater than 400 nm.

16. An exposure method according to claim 15, wherein the exposure light is supplied by one of a KrF excimer laser, an ArF excimer laser and an F2 excimer laser.

17. A multiple exposure method comprising:

a step of exposing a photosensitive material with a first pattern having a periodic pattern; and a step of exposing the photosensitive material with a second pattern different from the first pattern by using a projection optical system, wherein the step of exposing the photosensitive material with the second pattern is performed in each of a plurality of positions of the photosensitive material in an optical axis direction of the projection optical system relative to a focus position of an image of the second pattern, wherein a desired pattern is formed in the photosensitive material by a multiple exposure including the step of exposing the photosensitive material with the first pattern and the step of exposing the photosensitive material with the second pattern, and wherein the plurality of positions of the photosensitive material in the optical axis direction of the projection optical system relative to the focus position of the image of the second pattern are obtained by chromatic aberration of the projection optical system and a plurality of exposure light beams having different wavelengths.

18. A method of manufacturing a device, comprising:

a process of exposing a resist of a wafer with a device pattern in accordance with a multiple exposure method according to claim 17; and a process of developing the exposed wafer.

19. A multiple exposure method, comprising:

a first step of exposing a photosensitive element with a periodic pattern based on interference of two light beams; and a second step of exposing the photosensitive element with a pattern different from the periodic pattern by using a projection optical system, the first step having a depth of exposure larger than a depth of exposure in the second step, wherein, in the first step, a position in an optical axis direction of the projection optical system of the photosensitive element relative to a focus position of the periodic pattern is set at one position to effect exposure, while in the second step, the position in the optical axis direction of the projection optical system of the photosensitive element is set at plural positions within a depth of exposure in the first step to effect exposure at each of the plural positions.

20. A method according to claim 19, wherein the periodic pattern includes a number of fine lines, the pattern to be exposed in the second step is an image of a circuit pattern of a mask, and a portion of the number of fine lines and a portion of the image of the circuit pattern are exposed at the same position as the photosensitive element at a total amount of exposure exceeding a threshold value of the photosensitive element.

21. A method according to claim 20, wherein an exposure amount of a remaining portion of the image of the circuit pattern exceeds the threshold value of the photosensitive element.

22. A method according to claim 21, wherein the portion of the image of the circuit pattern includes a portion of a minimum line width of the circuit pattern.

23. A method according to claim 22, wherein the fine line of the periodic pattern has a line width the same as or smaller than a product obtained by multiplying the line width of the portion having the minimum line width by a projection magnification of the projection optical system.

24. A method according to claim 22, wherein the multiple exposure is effected so as to cause a peak of a light intensity distribution of the fine line to coincide or almost coincide with a center of the portion of the image of the circuit pattern.

25. A method according to claim 19, wherein the position in the optical axis direction of the projection optical system of the photosensitive element relative to the focus position is set at plural positions by effecting the exposure with a plurality of exposure light beams of mutually different wavelengths in the second step.

26. A method according to claim 19, wherein the position in the optical axis direction of the projection optical system of the photosensitive element relative to the focus position of the pattern different from the periodic pattern is set at plural positions by displacing the photosensitive element or the mask in the optical axis direction.

27. A method according to claim 19, wherein the second step of exposure is effected by a scanning exposure, and the position in the optical axis direction of the projection optical system of the photosensitive element is set at plural positions by scanning the mask relative to the second pattern in a direction vertical to the optical axis and scanning the photosensitive element in a direction not vertical to the optical axis in synchronism with the vertical scanning.

28. A method according to claim 27, wherein the following condition is satisfied:

$$S \times \tan \theta < D$$

wherein S represents a length in a scanning direction of the whole exposure range by the scanning exposure, $\theta$ represents an inclination of the photosensitive element to a best focus plane and D represents a depth of the periodical pattern.

29. A method according to claim 19, wherein the second step of exposure is effected by using a mask having a pattern of the same shape as a circuit pattern to be finally exposed on the photosensitive element.

30. A method according to claim 19, wherein when the exposure is effected at n numbers of positions in the second step, a space between adjacent positions of the plural positions is set not larger than a value obtained by dividing the depth of the periodic pattern by n−1.

31. A method according to claim 30, wherein when the position in the optical axis direction of the projection optical system of the photosensitive element is set relative to the focus position in the second step at plural positions by effecting the exposure by the plural exposure light beams of mutually different wavelengths, the exposure is effected by changing a wave width $\Delta\lambda$ by $\Delta\lambda = \lambda d/(n-1)$ wherein $\lambda d$ represents a difference between a largest wavelength and a shortest wavelength.

32. A method according to claim 19, wherein the exposure is effected in the order from the first step to the second step or in the order from the second step to the first step.

33. A method according to claim 19, wherein the second step of exposure is effected by an exposure light beam having a central wavelength not longer than 365 nm.

34. A method according to claim 33, wherein the exposure light beam is light of i-line or a laser beam supplied from a KrF, an ArF or an F2 excimer laser.

35. A method of producing a device comprising:

a step of exposing a wafer with a device pattern according to the exposure method of any one of claims 19 to 34; and a step of developing the exposed wafer.

* * * * *

UNITED STATES PATENT AND TRADEMARK OFFICE
CERTIFICATE OF CORRECTION

PATENT NO. : 6,403,291 B1
DATED : June 11, 2002
INVENTOR(S) : Miyoko Kawashima et al.

It is certified that error appears in the above-identified patent and that said Letters Patent is hereby corrected as shown below:

Column 5,
Line 38, "of:minute" should read -- of minute --.

Column 7,
Line 43, "(n-1)" should read -- (n-1). --.

Column 15,
Line 51, "σ," should read -- π, --.

Column 16,
Line 57, "pattern:obtained" should read -- pattern obtained --.

Column 24,
Line 61, ""0.62)" should read -- 0.6$^2$) --.

Column 27,
Line 52, "less" should read -- lesser --.

Column 30,
Line 7, "are" should read -- is --.

Column 31,
Line 21, "are" should read -- is --.

Signed and Sealed this

Twelfth Day of November, 2002

*Attest:*

JAMES E. ROGAN
*Attesting Officer*   *Director of the United States Patent and Trademark Office*